(12) United States Patent
Then et al.

(10) Patent No.: US 11,183,613 B2
(45) Date of Patent: Nov. 23, 2021

(54) GROUP III-NITRIDE LIGHT EMITTING DEVICES INCLUDING A POLARIZATION JUNCTION

(71) Applicant: Intel Corporation, Santa Clara, CA (US)

(72) Inventors: Han Wui Then, Portland, OR (US); Sansaptak Dasgupta, Hillsboro, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 62 days.

(21) Appl. No.: 16/643,924

(22) PCT Filed: Sep. 29, 2017

(86) PCT No.: PCT/US2017/054390
§ 371 (c)(1),
(2) Date: Mar. 3, 2020

(87) PCT Pub. No.: WO2019/066921
PCT Pub. Date: Apr. 4, 2019

(65) Prior Publication Data
US 2020/0411722 A1 Dec. 31, 2020

(51) Int. Cl.
*H01L 33/32* (2010.01)
*H01L 33/00* (2010.01)
(Continued)

(52) U.S. Cl.
CPC ........ *H01L 33/325* (2013.01); *H01L 33/0075* (2013.01); *H01L 33/06* (2013.01); *H01L 33/62* (2013.01)

(58) Field of Classification Search
CPC ... H01L 33/325; H01L 33/0075; H01L 33/06; H01L 33/62
(Continued)

(56) References Cited

U.S. PATENT DOCUMENTS

| 4,216,036 A | 8/1980 | Tsang |
| 6,630,695 B2 | 10/2003 | Chen et al. |

(Continued)

FOREIGN PATENT DOCUMENTS

| JP | 2011049488 | 3/2011 |
| KR | 20140026486 | 3/2014 |

(Continued)

OTHER PUBLICATIONS

International Preliminary Report on Patentability from PCT/US2017/054358 dated Apr. 9, 2020, 12 pgs.

(Continued)

*Primary Examiner* — Igwe U Anya
(74) *Attorney, Agent, or Firm* — Green, Howard & Mughal LLP

(57) ABSTRACT

Light emitting devices employing one or more Group III-Nitride polarization junctions. A III-N polarization junction may include two III-N material layers having opposite crystal polarities. The opposing polarities may induce a two-dimensional charge carrier sheet within each of the two III-N material layers. Opposing crystal polarities may be induced through introduction of an intervening material layer between two III-N material layers. Where a light emitting structure includes a quantum well (QW) structure between two Group III-Nitride polarization junctions, a 2D electron gas (2DEG) induced at a first polarization junction and/or a 2D hole gas (2DHG) induced at a second polarization junction on either side of the QW structure may supply carriers to the QW structure. An improvement in (Continued)

quantum efficiency may be achieved where the intervening material layer further functions as a barrier to carrier recombination outside of the QW structure.

19 Claims, 12 Drawing Sheets

(51) Int. Cl.
H01L 33/06 (2010.01)
H01L 33/62 (2010.01)

(58) Field of Classification Search
USPC .......................................................... 257/79
See application file for complete search history.

(56) References Cited

U.S. PATENT DOCUMENTS

| | | | |
|---|---|---|---|
| 8,021,904 | B2 | 9/2011 | Chitnis |
| 8,718,110 | B2 | 5/2014 | Kyono et al. |
| 2005/0098835 | A1 | 5/2005 | Ushiroda et al. |
| 2007/0194330 | A1 | 8/2007 | Ibbetson et al. |
| 2008/0185608 | A1 | 8/2008 | Chitnis |
| 2010/0059781 | A1* | 3/2010 | Yokobayashi .......... H01L 33/44 257/98 |
| 2010/0187550 | A1 | 7/2010 | Reed et al. |
| 2010/0327322 | A1 | 12/2010 | Kub et al. |
| 2011/0012109 | A1 | 1/2011 | Kryliouk et al. |
| 2011/0159669 | A1 | 6/2011 | Yang et al. |
| 2011/0233602 | A1 | 9/2011 | Hwang |
| 2012/0012869 | A1* | 1/2012 | Song ....................... H01L 33/44 257/91 |
| 2012/0211801 | A1 | 8/2012 | Hashimoto et al. |
| 2012/0322189 | A1* | 12/2012 | Nakada ................. H01L 33/007 438/46 |
| 2013/0026489 | A1 | 1/2013 | Gambin et al. |
| 2013/0075824 | A1 | 3/2013 | Fukushima et al. |
| 2013/0221409 | A1 | 8/2013 | Nakajima et al. |
| 2018/0026156 | A1* | 1/2018 | Zhang ..................... H01L 33/16 257/76 |

FOREIGN PATENT DOCUMENTS

| | | |
|---|---|---|
| WO | 2013101184 | 7/2013 |
| WO | 2016209263 | 12/2016 |
| WO | 2017153906 | 9/2017 |

OTHER PUBLICATIONS

International Search Report and Written Opinion from PCT/US2017/054390 dated Jun. 29, 2018, 15 pgs.

* cited by examiner

GROUP III-NITRIDE LIGHT EMITTING DEVICES INCLUDING A POLARIZATION JUNCTION

CLAIM OF PRIORITY

This Application is a National Stage Entry of, and claims priority to, PCT Application No. PCT/US2017/054390, filed on Sep. 29, 2017 and titled "GROUP III-NITRIDE LIGHT EMITTING DEVICES INCLUDING A POLARIZATION JUNCTION", which is incorporated by reference in its entirety for all purposes.

BACKGROUND

Solid state light emitting devices, or light emitters, find widespread applications from electronic displays to general illumination. Some display technology, referred to as crystalline light emitting diode (LED), or as inorganic LED (iLED), employ an array of crystalline semiconductor LED chips. Each emitter of an LED chip typically includes a Group III-Nitride (III-N) heterostructure having a plurality of III-N material layers including a quantum well (QW) structure. The QW structure is to confine electrons and holes so they may recombine to generate photons of a desired wavelength (color). Devices for general illumination applications may also rely on emitters having a III-N heterostructure that includes an QW structure. A laser is an example of another light emitting device that may likewise have a plurality of III-N material layers including a QW structure. Additional mirror structures (e.g., Bragg reflectors, etc.) may be included within a light emitter to induce lasing.

Internal quantum efficiency (IQE) of a light emitter is the measure of how efficiently the emitter converts injected charge carriers (electrons and holes) into photons (light). High current densities are required in applications where high light output is required from a small area device, such as a display, automotive headlights, and micro-LED applications. III-N light-emitting diodes and lasers can suffer a loss of IQE at high current densities. This loss in IQE at high current densities may be due, at least in part, to poor electron confinement within the QW structure and also poor injection efficiency of holes from p-GaN into the QW structure.

To date, attempts to mitigate this LED efficiency droop have included introducing one or more electron blocking layers (EBLs) within a III-N heterostructure. An EBL is generally a III-N material (e.g., AlGaN) that has a wider band gap than the QW structure (e.g., InGaN/GaN bilayers). The EBL improves the confinement of the electrons in the QW, for example by blocking electrons in the conduction band from rushing towards a p-type terminal material (e.g., p-GaN) where it can be lost via non-radiative recombination with free carrier holes. However, because the EBL also introduces a valence band offset, the EBL also creates a barrier that blocks the injection of holes from the p-type terminal into the QW structure. This hole blocking reduces the injection efficiency of hole injection. To improve the hole injection efficiency, EBLs may be interleaved with lower bandgap layers (e.g., InGaN) in a superlattice structure that ideally permits the quantum mechanical tunneling of holes from p-type terminal material to the QW structure. However, the EBL barrier to electrons in the conduction band is also effectively lowered by this superlattice because electrons can now also tunnel from the QW structure to the p-type terminal without participating in radiative recombination. New light emitter architectures that may avoid these limitations are therefore advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements. In the figures.

DETAILED DESCRIPTION

Figure 1A:
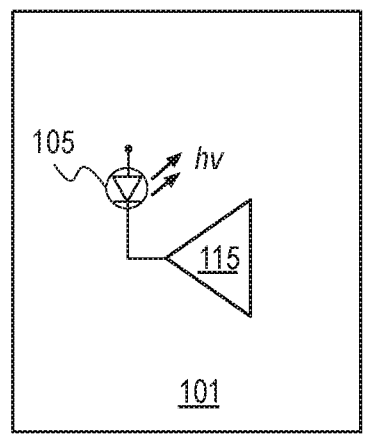
FIG. 1A is a schematic of a device with a LED circuit, in accordance with some embodiments.

One or more embodiments are described with reference to the enclosed figures. While specific configurations and arrangements are depicted and discussed in detail, it should be understood that this is done for illustrative purposes only.

Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" or "some embodiments" means that a particular feature, structure, function, or characteristic described in connection with the embodiment is included in at least one embodiment of the invention. Thus, the appearances of the phrase "in an embodiment" or "in one embodiment" or "some embodiments" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/of" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "above," "under," "below," "between," and "on" as used herein refer to a relative position of one component or material with respect to other components or materials where such physical relationships are noteworthy. For example in the context of materials, one material or material over/above or under/below another may be directly in contact or may have one or more intervening materials. Moreover, one material between two materials may be directly in contact with the two layers or may have one or more intervening material layers. In contrast, a first material "on" a second material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Light emitters employing one or more III-N polarization junctions are described herein. As described further below, a III-N heterostructure that includes a plurality of III-N material layers, or lamella, of different crystal polarities may be employed within a light emitter. Light emitter structures in accordance with some embodiments include a polarity inversion between a first layer of III-N material and a second layer of III-N material. The first and second III-N material layers may be separated by an intervening material layer that facilitates the polarity inversion. The polarity inversion may induce a first two-dimensional charge carrier sheet of a first type (e.g., a two dimensional hole gas or "2DHG") within each of the first and second layers of III-N material, for example near their interface with the intervening material layer. Light emitter structures further include a quantum well (QW) structure above, below, or otherwise adjacent to, the polarization junction. The charge carrier sheet may supply first charge carriers (e.g., holes) for recombination within the QW structure. The intervening material layer at the polarization junction may further confine charge carriers (e.g., electrons), concurrently achieving improvements in carrier injection efficiency and carrier confinement within the light emitter structure. As such, higher IQE may be achieved for light emitter structures having one or more of the architectures described further below. Light emitter architectures in accordance with one or more of the embodiments described herein may eliminate the need to introduce other electron confinement structures (e.g., EBLs) that detrimentally impact hole injection. Alternatively, light emitter architectures in accordance with one or more of the embodiments described herein may be combined with other electron confinement structures to enhance their effect.

Light emitter structures in accordance with some embodiments further include a second polarity inversion between the first layer of III-N material and a third layer of III-N material. The first and third layers of III-N material may be separated by a second intervening material layer that facilitates the second polarity inversion. The second polarity inversion may induce a second two-dimensional charge carrier sheet of a complementary type (e.g., a two dimensional hole gas or "2DEG") within each of the first and third III-N material layers, for example near their interface with the second intervening material layer. The charge carrier sheets induced at each crystal inversion may be on opposite sides of a QW structure. The charge carrier sheets are dependent upon the spontaneous and piezoelectric polarization of the III-N material layers and are additive, resulting in very high carrier densities. Hence, with multiple polarization junctions, light emitter performance may exceed that of other emitter architectures. Light emitter architectures in accordance with some embodiments may also enable lower contact resistance with terminal semiconductor material, particularly where a doping junction couples to a region of charge carrier sheet that scales with the area of semiconductor material interface.

Embodiments described herein are applicable to many semiconductor light emitter architectures, such as, but not limited to, light emitting diodes (LEDs) and lasers. The term "light emitter" is employed herein to refer to a broad class of semiconductor device architectures known to emit light. FIG. 1A is a schematic of a platform 101 that includes a light emission circuit with at least one LED 105 coupled to an emitter driver circuit 115, in accordance with some embodiments. The light emission circuit may be implemented by one or more IC chip, discrete components and combinations thereof. Platform 101 may be an electronic device, such as, but not limited to, a display, smartphone, ultrabook computer, embedded devices (e.g., internet of things, automotive applications, general illumination applications, etc.), wearables, and the like. During operation, driver 115 is to deliver a controlled voltage and/or current to LED 105. LED 105 may include a first terminal coupled to a first supply rail of driver 115 maintained at a nominal supply voltage (e.g., $V_{cc}$). LED 105 may further include a second terminal coupled to second supply rail maintained at a nominal reference voltage (e.g., $V_{ss}$). Under forward bias, LED diode 105 is to emit light within a band of the electromagnetic spectrum including one or more of the near infrared (NIR), the visible spectrum (including blue wavelengths of 380-405 nm), and ultraviolet wavelengths. As described further below, LED 105 includes a QW structure and at least one III-N polarization junction. The improved performance (e.g., higher IQE) of LED 105 may advantageously reduce the energy consumption of platform 101, and/or improve the optical output power of platform 101.

Figure 1B:
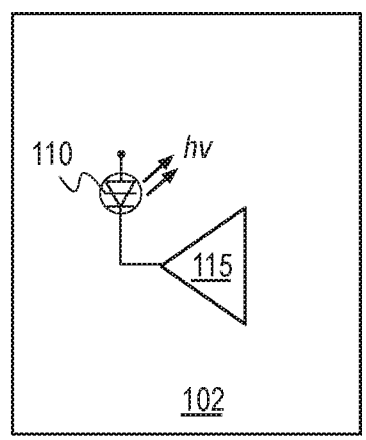
FIG. 1B is a schematic of a device with a laser circuit, in accordance with some embodiments.

FIG. 1B is a schematic of a platform 102 that includes a light emission circuit with at least one laser diode 110 coupled to emitter driver circuit 115, in accordance with some embodiments. The light emission circuit may be implemented by one or more IC chip, discrete components and combinations thereof. Platform 102 may be an electronic device, such as, but not limited to, a display, smartphone, ultrabook computer, embedded devices (e.g., internet of things, automotive applications, general illumination applications, etc.), wearables, and the like. During operation, driver 115 is to deliver a controlled voltage and/or current to laser 110. Laser 110 may include a first terminal coupled to a first supply rail of driver 115 maintained at a nominal supply voltage (e.g., $V_{cc}$). Laser 110 may include a second terminal coupled to second supply rail maintained at a nominal reference voltage (e.g., $V_{ss}$). Under forward bias, stimulated emission occurs within a band of the electromagnetic spectrum including one or more of the near infrared (NIR), the visible spectrum (including blue wavelengths of 380-405 nm), and ultraviolet wavelengths. Laser 110 may include a QW structure and at least one III-N polarization junction, substantially as described below. The improved performance (e.g., higher IQE) of such a laser may advantageously reduce the energy consumption of platform 102, and/or improve the optical output power of platform 102.

Figure 2:
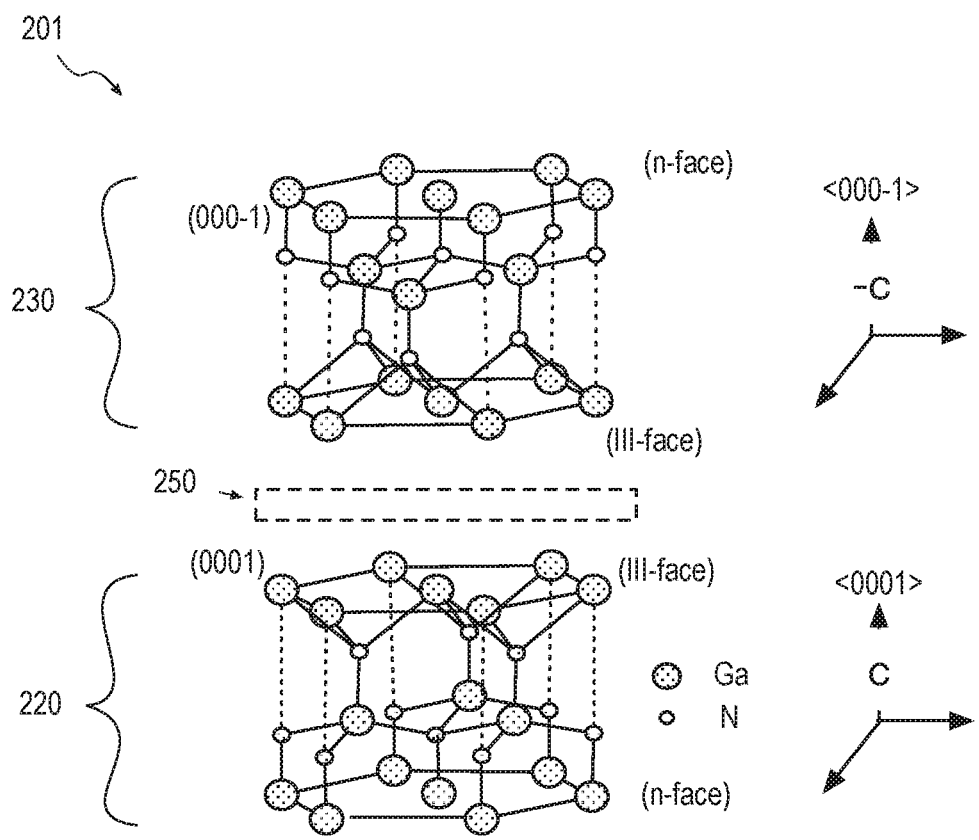
FIG. 2 is an isometric illustration showing crystal polarity inversion at a III-N polarization junction, in accordance with some embodiments.
Figure 3:
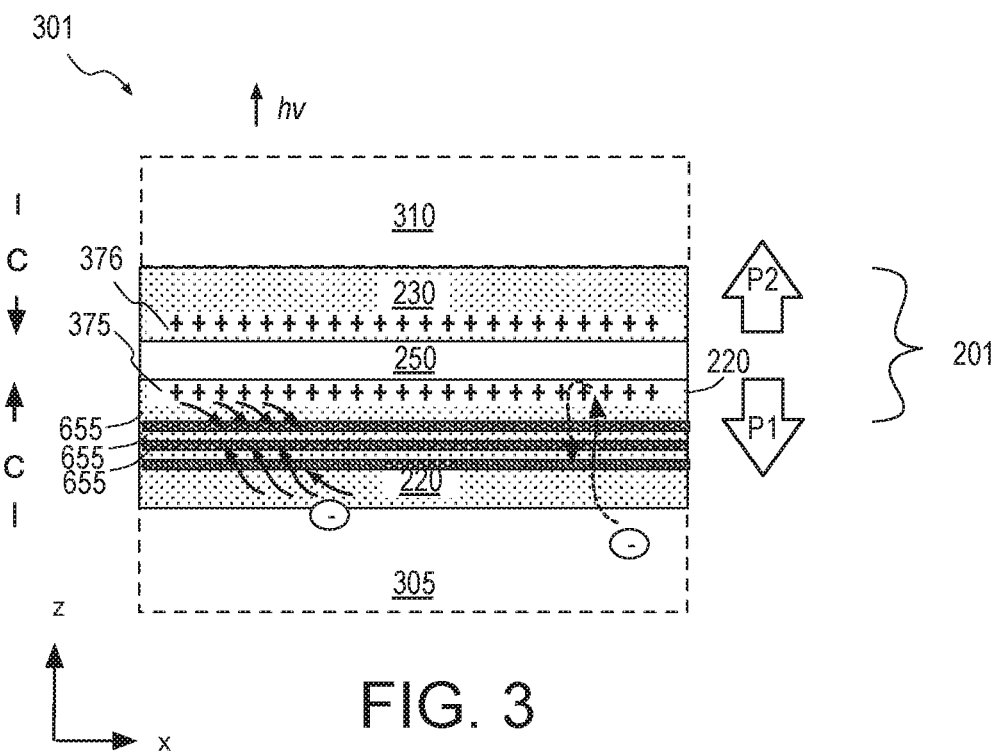
FIG. 3 is a cross-sectional view of a light emitter structure including the III-N polarization junction shown in FIG. 2, in accordance with some embodiments.

FIG. 2 is an isometric illustration showing crystal polarity inversion of a III-N polarization junction 201, in accordance with some embodiments. FIG. 3 is a cross-sectional view of a light emitter structure 301 structure that integrates the III-N polarization junction 201 with a QW structure that further includes one or more QW layer 655, in accordance with some embodiments. Either of LED 105 (FIG. 1A) or laser 110 (FIG. 1B) may have one or more of the features further described below in the context of III-N polarization junction 201, or light emitter structure 301, for example.

As shown in FIG. 2, polarization junction 201 includes a first Group III-nitride (III-N) material layer 220, an intervening material layer 250, and a second III-N material layer 230. Although illustrated as layers for the sake of simplification, it is noted that equivalent references may be made to laterally (horizontally) arranged III-N materials. III-N material layer 220 may be any III-N material, such as a binary alloy (e.g., GaN, AlN, InN), a ternary alloy (e.g., $Al_xIn_{1-x}N$, $In_xGa_{1-x}N$, or $Al_xGa_{1-x}N$), or quaternary alloy (e.g., $In_xGa_yAl_{1-x-y}N$). III-N material layer 230 may likewise be any III-N material. In some embodiments, III-N material layer 230 has the same composition as III-N material layer 220. In other embodiments, III-N material layer 230 has a composition distinct from III-N material layer 220. III-N material layer 230 may be, for example, a binary alloy (e.g., GaN, AlN, InN), a ternary alloy (e.g., $Al_xIn_{1-x}N$, $In_xGa_{1-x}N$, or $Al_xGa_{1-x}N$), or quaternary alloy (e.g., $In_xGa_yAl_{1-x-y}N$). In some advantageous embodiments, III-N material layers 220 and 230 are intrinsic and not intentionally doped with impurities associated with a particular conductivity type. Intrinsic impurity (e.g., Si) levels in III-N material layers 220 and 230 may be advantageously less than 1e17 atoms/$cm^3$, and in some exemplary embodiments is between 1e14 and 1e16 atoms/$cm^3$. In some of these embodiments, III-N material layers 220 and 230 are both intrinsic binary GaN (i-GaN).

III-N material layers 220 and 230 may each have monocrystalline microstructure (e.g., hexagonal Wurtzite). Although monocrystalline, it is noted that crystal quality of the III-N crystal may vary dramatically, for example as a function of the techniques employed to form material layers 220 and 230. In some exemplary embodiments, dislocation density with III-N material layers 220 and 230 is in the range of $10^6$-$10^{11}$/$cm^2$. FIG. 2 illustrates crystal orientations of III-N material layers, 220 and 230, in accordance with some embodiments. The crystal structure of III-N material layer 220 lacks inversion symmetry, as does the crystal structure of III-N material layer 230. As shown, III-N material layer 220 has a polar group III (e.g., Ga)-face and a polar nitrogen (N)-face. Higher order planes may be semi-polar. The (0001) and (000-1) planes are not equivalent. Relative to a plane of intervening material layer 250, III-N material layer 220 may be characterized as having +c polarity with the c-axis extending in the <0001> direction that is out of the plane of intervening material layer 250, and/or of an underlying substrate (not depicted). The orientation of III-N material layer 220 may therefore be referred as Group III-face, or III-face III-N, or (000-1) III-N, or as having Group III-polarity (+c). The crystal orientation of III-N material layer 230 is inverted relative to that of III-N material layer 220, and may be characterized has having –c polarity with the c-axis extending in the <000-1> direction out of the plane intervening material layer 250, and/or of an underlying substrate. The orientation of III-N material layer 230 may therefore be referred as N-face, (e.g., N-face III-N), or as (000-1) III-N, or as having N-polarity (–c).

As further illustrated in FIG. 3, because the crystal orientation, or crystal polarity, of III-N material layer 230 is inverted with respect to that of III-N material layer 220, the c-axes of III-N material layers 220 and 230 are aligned substantially anti-parallel. Although illustrated as anti-parallel, it is noted that the crystal orientations of material layers 220 and 230 may vary by 5-10° from an anti-parallel target as a result of processing conditions, and the impact of such misalignment of the crystals may merely be a slight reduction in polarization field strength. The junction between III-N material layers 220 and 230 is referred to herein as a "polarization junction" for at least the reason that crystals of different polarization or polarity meet (e.g., at their interface with intervening material layer 250). III-N material layer 220 is associated with a polarization field strength $P_1$ that is a function of spontaneous and/or piezoelectric polarization field strength for the selected III-N alloy composition. III-N material layer 230 is likewise associated with a polarization field strength $P_2$ that is a function of spontaneous and/or piezoelectric polarization field strength for the selected III-N alloy composition. Because of the anti-parallel polarities of III-N material layer 220 and III-N material layer 230, two dimensional charge carrier (gas) sheets 375 and 376 are formed within at least a portion of III-N material layers 220, 230 proximal to their interface (e.g., proximal to intervening material layer 250). Notably, because of the anti-parallel crystal polarities, the two dimensional charge carrier sheets 375 and 376 are induced by a summation of the polarization field strengths P1 and P2. This is in contrast to a charge carrier gas that may be induced as a result of differences between the polarization field strengths of two different III-N compositions at a heterojunction having a single crystal polarity. Hence, in some exemplary embodiments where III-N material layers 220 and 230 have the same composition (e.g., both are i-GaN), polarization field strength P1 is equal to polarization field strength P2 (i.e., P1=P2). Following Maxwell's equations, the two dimensional charge carrier sheets 375 and 376 are then are result of a field equal to P2+P2, or 2*P2. Thus, very high charge carrier densities may be present within a few nanometers on either side of polarization junction 201.

The relative crystal orientations shown in FIGS. 2 and 3 induce positive charge carrier sheets 375, 376. Because the anti-parallel polarization fields of III-N material layers 220, 230 point away from polarization junction 201, the resultant polarization doping is P-type. Polarization junction 201 (FIG. 2) may therefore be referred to as a P-type polarization junction. Positive charge carrier sheets 375, 376 may also be referred to as two-dimensional hole gases (2DHG). These 2DHGs are the result of III-N material layer 220 having the polar Group III-face (e.g., Ga-face) adjacent to intervening material layer 250 and the polar N-face opposite, or distal to, intervening material layer 250. III-N material layer 230 also has the Group III-face (e.g., a Ga-face) adjacent to intervening material layer 250, and the nitrogen (N)-face opposite, or distal to, intervening material layer 250. Positive charge carrier sheets 375, 376 may be proximal (e.g., with 2-4 nm) to the interface of intervening material layer 250. In some such embodiments III-N material layer 230 therefore has a thickness of at least 3 nm, and may be less than 10 nm.

Intervening material layer 250 may be any material or materials suitable for facilitating the formation of polarization junction 201. For example, in some embodiments intervening material layer 250 includes a material that facilitates a crystal polarity inversion during an epitaxial growth of III-N material layer 230. For such embodiments, intervening material layer 250 may be (mono)crystalline. As another example, in some embodiments intervening material layer 250 includes a material that facilitates a bonding of III-N material layer 230 to III-N material layer 220. For such embodiments, intervening material layer 250 may be monocrystalline, polycrystalline, or amorphous. In some amorphous or (poly)crystalline embodiments, intervening material layer 250 is a discontinuous film layer that comprises islands of amorphous or (poly)crystalline material dispersed over the surface of III-N material layer 230. Intervening material layer 250 may have any suitable thickness (e.g., along the c-axis). In some embodiments, intervening material layer 250 has a thickness not more than 5 nm, and advantageously not more than 3 nm. In an embodiment, intervening material layer 250 is a crystalline material including less than 10, advantageously less than 7, and potentially even less than 5 monolayers.

In some exemplary crystalline embodiments, intervening material layer 250 has other than hexagonal crystallinity (i.e., crystallinity other than that of III-N material layers 220, 230). In some examples, intervening material layer 250 may have trigonal crystallinity. In some other examples, intervening material layer 250 may have cubic crystallinity. Having crystallinity other than that of the III-N material system may advantageously facilitate polarity inversion while still providing a crystalline seeding surface that can maintain monocrystallinity of III-N material layer 230, for example. In some exemplary embodiments, intervening material layer 250 is other than a III-N material (e.g., other than a binary, ternary or quaternary III-N alloy). Intervening material layer 250 may, for example, include one or more of oxygen, a metal, or a metalloid. The metal may more specifically be a rare earth, a lanthanide, a transition metal, or a post-transition (e.g., group III) metal. In some exemplary embodiments, intervening material layer 250 is, or includes, aluminum oxide ($Al_xO_y$). In some such embodiments, intervening material layer 250 is crystalline aluminum oxide (e.g., sapphire). In some other embodiments, intervening material layer 250 is, or includes, scandium oxide ($Sc_xO_y$). In some other embodiments, intervening material layer 250 is, or includes, scandium nitride ($Sc_xN_y$) material, aluminum oxy-nitride (AlNO), or scandium oxy-nitride (ScNO). In some such embodiments, intervening material layer 250 is crystalline scandium oxide. In still other embodiments, intervening material layer 250 is, or includes, a mixed metal alloy, such as, but not limited to, aluminum scandium oxide.

Although in some embodiments, intervening material layer 250 is in direct contact with both III-N material layer 220 and III-N material layer 230, one or more material layers may also separate intervening material layer 250 from III-N material layer 220 and/or from intervening material layer 230. For example, intervening material layer 250 may be within a stack of material layers separating III-N material layer 220 from III-N material layer 230. In some embodiments, intervening material layer 250 is in contact with (e.g., on or under) a (mono)crystalline aluminum nitride (AlN) layer, or other crystalline III-N material suitable as an epitaxial nucleation layer. For example, intervening material layer 250 may be an oxide of an underlying AlN layer, or an oxide of an overlying AlN layer. In either case, intervening material layer 250 may be predominantly $Al_xO_y$. Intervening material layer 250 may also be between two (mono)crystalline AlN layers. For example, intervening material layer 250 may be a layer of aluminum oxide located between a first and a second (mono)crystalline aluminum nitride layer.

In some amorphous or (poly)crystalline embodiments, intervening material layer 250 is, or includes, one or more of, aluminum oxide, silicon oxide, silicon nitride, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, tantalum oxide, tantalum silicon oxide, lead scandium tantalum oxide, and lead zinc niobate. These oxides can have a relatively high degree of crystallinity, for example when deposited with atomic layer deposition.

As further illustrated in FIG. 3, light emitter structure 301 further includes a QW structure that is electrically coupled to a first side of polarization junction 201. In the illustrated embodiment, III-N material layer 220 may be considered part of the QW structure with at least one QW layer 655 interleaved within III-N material layer 220. The QW structure has one crystal polarity with both QW layer 655 and III-N material layer 220 having the same polarity (e.g., +c). QW structures in accordance with embodiments herein may have any number of QW layers (e.g., 1, 2, 3, or more). QW layer 655 may be of any III-N material composition that has a smaller bandgap than that of III-N material layer 220. QW layer 655 may be, for example, a binary alloy (e.g., GaN, InN), a ternary alloy (e.g., $Al_xIn_{1-x}N$, $In_xGa_{1-x}N$, or $Al_xGa_{1-x}N$), or quaternary alloy (e.g., $In_xGa_yAl_{1-x-y}N$). The bandgap and thickness of QW layer 655 may be selected to emit light at a predetermined wavelength. For some exemplary embodiments, QW layer 655 comprises $In_xGa_{1-x}N$ with x varying between 0.02 and 0.41. One or more such QW layer may be interleaved within GaN, for example. QW layer 655 may have any thickness known to be suitable for such an emission layer, and may for example be limited to thicknesses capable of quantum carrier confinement. In some embodiments, QW layer 655 has a thickness of a few nanometers to a few tens of nanometers. QW layer 655 may be intrinsic (not intentionally doped) or may be doped with either p-type (acceptor) impurities or n-type (donor) impurities. Likewise, portions of III-N material layer 220 between QW layers 655 may also be intrinsic, or may be doped to the same conductivity type as an adjacent QW layer 655.

With polarization junction 201 inducing the positive charge carrier sheet 375, any terminal layer 305 may serve as a source of negative charge carriers, which during the operation of light emitter structure 301 are to radiatively combine with holes supplied by positive charge carrier sheet 375 as illustrated in FIG. 3 by solid line arrows. Terminal layer 305 may vary with implementation with a few exemplary embodiments described further below. Embodiments of light emitter structure 301 are not limited in this context however, and therefore terminal layer 305 is illustrated in dashed line. As further illustrated by a dashed line arrow in FIG. 3, any negative charge carriers that manage to transit all QW layers 655 without combining radiatively, will encounter intervening material layer 250. In exemplary embodiments, intervening material layer 250 poses a significant energy barrier to such negative charge carriers, for example largely preventing negative charge carrier transit through intervening material layer 250. Intervening material layer 250 therefore confines negative charge carriers to within III-N material layer 220 (and the QW layers therein). Loss of IQE, for example associated with greater electron mobility in III-N materials and/or lower hole injection efficiency, may be diminished through this electron blocking or confinement by intervening material layer 250. A contact terminal 310 may be made to charge carrier sheet 376 and/or or charge carrier sheet 375. Contact terminal 310 may advantageously bypass intervening material layer 250 so that hole injection is not also blocked by intervening material layer 250. Some exemplary structures are further described below. However, embodiments of light emitter structure 301 are not limited in this context, and therefore terminal 310 is illustrated in dashed line. Regardless of how positive carriers are supplied to charge carrier sheet 375, the area over which hole injection may occur may be advantageously large because charge carrier sheet 375 is present over the entire area of QW layer 655. Also, the high density of states associated with charge carrier sheet 375 may provide an advantageously high hole injection rate per unit area of QW layer(s) 655. These factors, alone or in combination, may enable light emitter structure 301 to achieve high IQE during operation.

QW layers 655 are illustrated in FIG. 3 as being separated from intervening material layer 250 by a thickness of III-N material layer 220. In some embodiments where charge carrier sheet 375 is within 2-4 nm of intervening material layer 250, III-N material layer 220 between intervening material layer 250 and the QW layer 655 nearest to intervening material layer 250 has a thickness of at least 3 nm, and may also be less than 10 nm. In alternative embodiments, the intervening material layer may instead interface with a QW layer. For example, in FIG. 3, intervening material layer 250 may be in direct contact with QW layer 655, with QW layer 655 then located between intervening material layer 250 and III-N material layer 220. Charge carrier sheet 375 may then reside within QW layer 655. Hole injection may be directly into QW layer 655.

Figure 4:
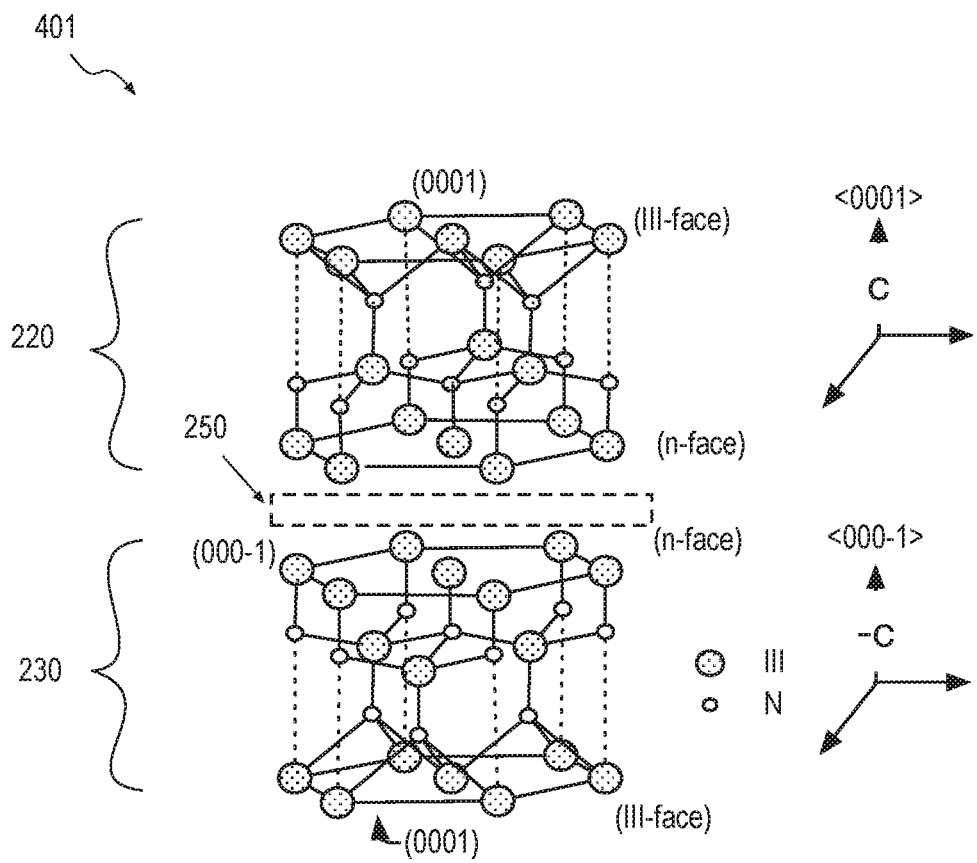
FIG. 4 is an isometric illustration showing crystal polarity inversion at a III-N polarization junction, in accordance with some embodiments.
Figure 5:
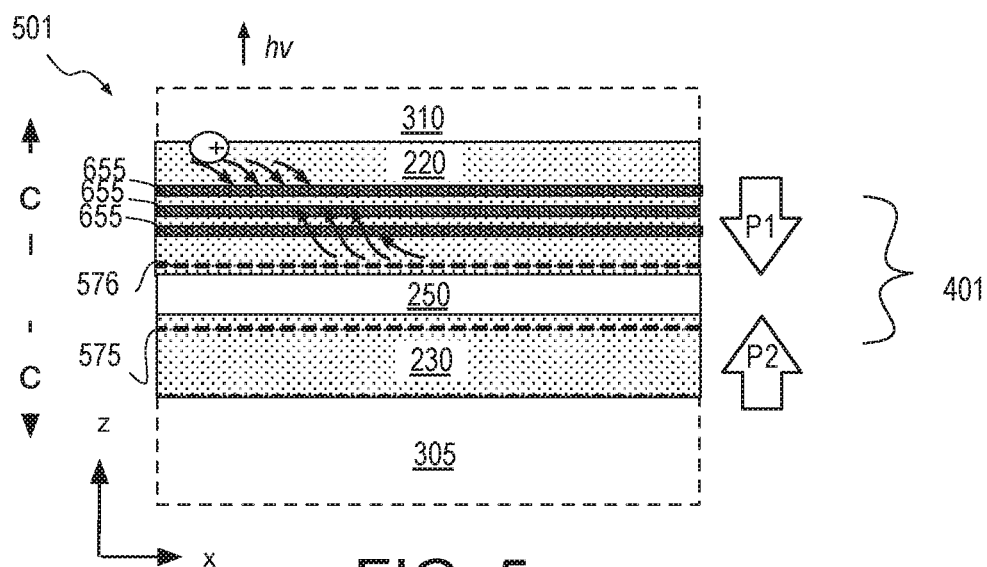
FIG. 5 is a cross-sectional view of a light emitter structure including the III-N polarization junction shown in FIG. 4, in accordance with some embodiments.

FIG. 4 is an isometric illustration showing crystal polarity inversion at a III-N polarization junction 401, in accordance with some embodiments. FIG. 5 is a cross-sectional view of a light emitter structure 501 that includes III-N polarization junction 401 and a QW structure including one or more QW layer 655, in accordance with some embodiments. Either of LED 105 (FIG. 1A) or laser 110 (FIG. 1B) may have one or more of the features further described below in the context of III-N polarization junction 201, or light emitter structure 301, for example.

As shown in FIGS. 4 and 5, polarization junction 401 includes the III-N material layers 220, and 230 with intervening material layer 250 again located between these layers. The reference numbers introduced in the context of FIG. 2 and FIG. 3 are retained in FIG. 4 and FIG. 5 for material layers that may have any of the properties described above in the context of polarization junction 201 and light emitter structure 301. Polarization junction 401 is however a N-type polarization junction with two dimensional (2D) charge carrier sheets 575 and 576 being high-density two-dimensional electron gases (2DEG). Negative charge carrier sheets 575 and 576 may be proximal (e.g., with 2-4 nm) of the interface of intervening material layer 250. The 2DEGs are the result of III-N material layers 220 and 230 having swapped positions relative to those introduced in the context of FIGS. 2 and 3.

In FIG. 4 and FIG. 5, III-N material layer 220 has the N-face adjacent to intervening material layer 250 and the Group III face (e.g., Ga-face) opposite, or distal to, intervening material layer 250. III-N material layer 230 also has the N-face adjacent to intervening material layer 250, and the Group III-face (e.g., a Ga-face) opposite, or distal to, intervening material layer 250. III-N material layer 220 is again associated with polarization field strength $P_1$ that is a function of spontaneous and/or piezoelectric polarization field strength for the selected III-N alloy composition. III-N material layer 230 is likewise associated with polarization field strength $P_2$. Because of the substantially anti-parallel polarities of III-N material layer 220 and III-N material layer 230, two dimensional charge carrier sheets 575 and 576 are formed within at least a portion of III-N material layers 220, 230 proximal to their interface (e.g., proximal to intervening material layer 250). Notably, the two dimensional charge carrier sheets 575 and 576 are induced by a summation of the polarization field strengths P1 and P2. In some exemplary embodiments where III-N material layers 220 and 230 interfacing intervening material layer 250 have the same composition (e.g., both are i-GaN), polarization field strength P1 is equal to polarization field strength P2 (i.e., P1=P2). Following Maxwell's equations, the two dimensional charge carrier sheets 575 and 576 are then the result of a field equal to −P2-P2, or −2*P2. Thus, because the anti-parallel polarization fields of III-N material layers 220, 230 point toward polarization junction 401, the resultant polarization doping is complementary to that associated with polarization junction 201 (FIG. 2).

Intervening material layer 250 may be any of the materials described above. As further illustrated in FIG. 5, light emitter structure 501 further includes a QW structure that is electrically coupled to a first side of polarization junction 401. In the illustrated embodiment, III-N material layer 230 may be considered part of the QW structure with at least one QW layer 655 interleaved within III-N material layer 230. The QW structure has one crystal polarity with both QW layer 655 and III-N material layer 230 having the same polarity (e.g., +c). QW layer(s) 655 and III-N material layer 230 may be of any III-N material composition, such as any of those materials described above for QW layer(s) 655 and III-N material layer 230 in the context of FIGS. 2 and 3.

Polarization junction 401 may be above any terminal layer 305. Embodiments of light emitter structure 501 are not limited in this context, and terminal layer 305 is therefore again illustrated in dashed line. Terminal layer 305 may serve as a source of negative charge carriers that are to be injected into QW layer(s) 655, which are to radiatively combine with holes supplied by terminal 310, as illustrated in FIG. 5 by solid line arrows. Terminal 310 may vary with implementation and is also illustrated in dashed line. In one exemplary embodiment, terminal 310 includes polarization junction 201, as further described below. In an alternative embodiment, terminal 310 includes an impurity-doped semiconductor junction.

Positive charge carriers that manage to transit all QW layers 655 without combining radiatively will encounter intervening material layer 250. In exemplary embodiments, intervening material layer 250 poses a significant energy barrier to such positive charge carriers, for example largely preventing positive charge carrier transit through intervening material layer 250. Intervening material layer 250 may also confine negative charge carriers substantially as described above. As described further below, a contact terminal may be made to charge carrier sheet 576, bypassing intervening material layer 250 so that electron injection is not also blocked by intervening material layer 250. Some exemplary structures are further described below, however embodiments of light emitter structure 501 are not limited in this context. Regardless of how negative carriers are supplied to charge carrier sheet 576, because charge carrier sheet 576 is present over the entire area of QW layer 655, the area over which electron injection may occur may be advantageously large. Also, the high density of states associated with charge carrier sheet 576 may provide an advantageously high electron injection rate per unit area of QW 655.

Although QW layers 655 are illustrated in FIG. 5 as being separated from intervening material layer 250 by a thickness of III-N material layer 220, in alternative embodiments, the intervening material layer may instead interface with a QW layer. For example, in FIG. 5, intervening material layer 250 may be in direct contact with QW layer 655, with QW layer 655 then located between intervening material layer 250 and III-N material layer 220. Charge carrier sheet 575 may then reside within QW layer 655. Electron injection may then be directly into QW layer 655 where they may accumulate at QW layer 655 because of blocking by intervening material layer 250.

Figure 6A:
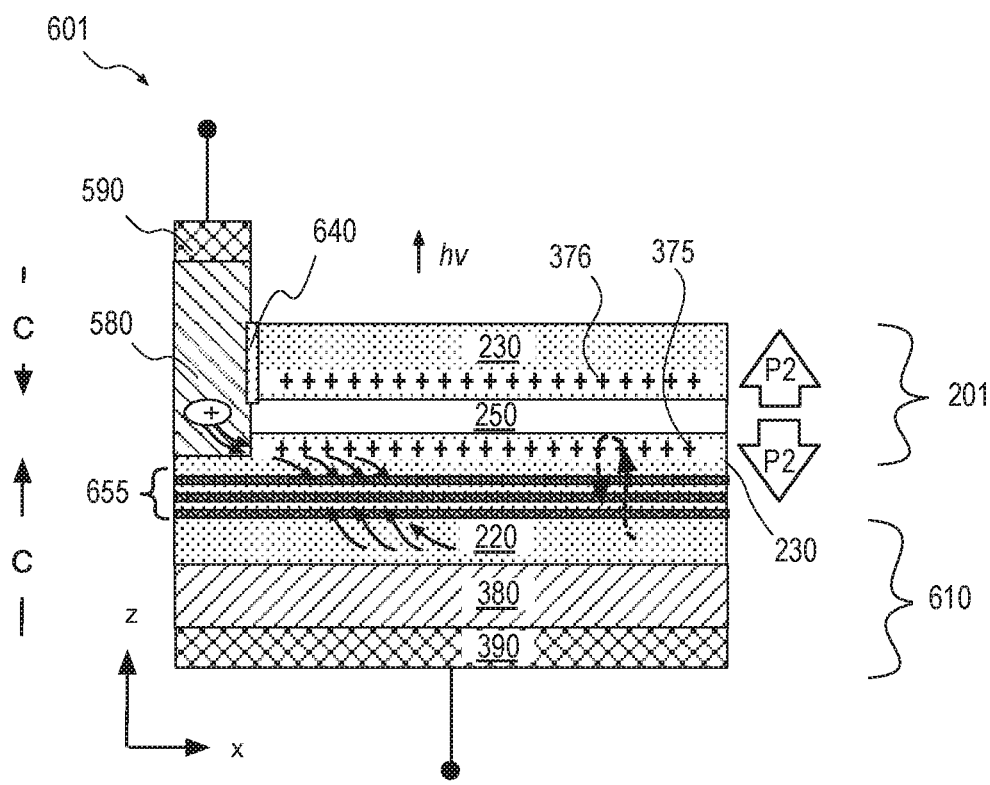
FIG. 6A is a cross-sectional view of a light emitter structure employing a QW structure between a P-type polarization junction and an N-type impurity-doped terminal, in accordance with some embodiments.

FIG. 6A is a cross-sectional view of a light emitter structure 601 employing a QW structure between a P-type polarization junction and an N-type impurity-doped terminal, in accordance with some embodiments. Light emitter structure 601 has a vertical architecture with two light emitter terminals on opposite sides of the QW structure. One of the terminals makes contact to a charge carrier sheet induced by the polarization junction, while the other terminal is coupled to the QW structure through an impurity-doped semiconductor. During operation of a light emitter incorporating light emitter structure 601, current will pass through a thickness (e.g., z-dimension) of the QW structure on a bottom side of polarization junction 201.

As shown, light emitter structure 601 includes a terminal 610 that includes terminal material 380 and a contact metallization 390. Terminal material 380 is operable as a low resistance semiconductor coupling to a first side of the QW structure that includes III-N material layer 220 and QW layer(s) 655. Contact metal 390 may include any metallization known to be suitable for providing a non-rectifying contact (e.g., ohmic or tunneling metal-semiconductor junction) to terminal material 380. In some exemplary embodiments, contact metal 390 includes at least one metal, such as Ti, Al, or W. In the illustrative embodiment, terminal material 380 is a III-N material having the same crystal orientation (e.g., +c polarity) as III-N material layer 220, and may advantageously include one or more impurity dopants imparting a desired conductivity type (e.g., N-type). In some exemplary embodiments, terminal material 380 includes a donor impurity dopant such as Si or Ge. In some such embodiments, the donor impurity concentration is at least 1e18/cm$^3$ within terminal material 380, and advantageously 1e19/cm$^3$, or more. Terminal material 380 may form a homojunction with III-N material layer 220, or terminal material 380 may form a heterojunction with III-N material layer 220. Hence, terminal material 380 may have the same majority lattice constituents as III-N material layer 220 or include other majority lattice constituents. In some advantageous embodiments, lower contact resistance may be achieved where terminal material 380 forms a heterojunction (e.g., abrupt or graded) with III-N material layer 220. In some exemplary embodiments, terminal material 380 has a narrower band gap than that of III-N material layer 220. For example, terminal material 380 may be a III-N alloy that includes more Indium (In) than III-N material layer 220. In some embodiments, terminal material 380 is donor-doped $In_xGa_{1-x}N$, (e.g., where x is between 0.05 and 0.2). Terminal material 380 may have any thickness permissible as a function of its conductivity.

As further illustrated in FIG. 6A, polarization junction 201 is separated from terminal material 380 by a QW structure that includes at least one QW layer 655 within III-N material layer 220. QW layer(s) 655 and III-N material layer 220 may have any of the properties described above in the context of FIGS. 2 and 3, for example. As illustrated, QW layers(s) 655 and III-N material layer 220 form bi-layers or a superlattice having the same (+c) polarity as terminal material 380. A portion of III-N material layer 220 between terminal material 380 and a first QW layer 655 may have any thickness, but is advantageously less than 10 nm. In some further embodiments, III-N material layer 220 between terminal material 380 and a first QW layer 655 has a thickness less than 10 nm, and advantageously at least 3 nm. A portion of III-N material layer 220 between intervening material layer 250 and a QW layer 655 closest to intervening material layer 250 may also have any thickness, but is advantageously less than 10 nm. In some further embodiments, III-N material layer 220 between intervening material layer 250 and a QW layer 655 closest to intervening material layer 250 has a thickness of at least 3 nm.

In light emitter structure 601, polarization junction 201 may have any of the properties described above in the context of FIGS. 2 and 3. As further illustrated in FIG. 6A, a terminal material 580 extends through III-N material layer 220 and intervening material layer 250, intersecting a region of III-N material layer 220 near where charge carrier sheet 375 (2DHG) resides. In the example illustrated, a sidewall of terminal material 580 forms a junction with a sidewall of III-N material layer 220 within the region where charge carrier sheet 375 resides. Hence, during operation much of the current between terminal material 580 and III-N material layer 220 can be expected to occur at this sidewall interface. This sidewall contact therefore allows hole current to bypass intervening material layer 250. Terminal material 580 is operable as a low resistance semiconductor coupling to polarization junction 201 (i.e., to charge carrier sheet 375). In the embodiment shown, terminal material 580 is a III-N material having the same crystal orientation (e.g., -c polarity) as III-N material layer 220, and may advantageously include one or more impurity dopants imparting a conductivity type matching that of polarization junction 201 (e.g., P-type). In some exemplary P-type embodiments, terminal material 580 includes acceptor impurity dopants, such as, but not limited to, Mg. While III-N materials can be challenging to dope p-type, Mg dopant levels of at least 1e17-1e18 atoms/cm$^3$ are achievable in binary GaN, for example. Terminal material 580 may form a homojunction with III-N material layer 220, or terminal material 580 may form a heterojunction with III-N material layer 220. Hence, terminal material 580 may have the same, or different, majority lattice constituents as III-N material layer 220. In some advantageous embodiments, lower contact resistance to polarization junction 401 may be achieved where terminal material 580 forms a heterojunction (e.g., abrupt or graded) with III-N material layer 220. In some exemplary embodiments, terminal material 580 has a narrower band gap than that of III-N material layer 220. For example, terminal material 580 may be a III-N alloy that includes more Indium (In) than III-N material layer 220. In some embodiments, terminal material 580 is acceptor-doped $In_xGa_{1-x}N$, (e.g., where x is between 0.05 and 0.2).

In some embodiments, terminal material 580 is crystalline, and may be substantially monocrystalline. In the embodiments illustrated by FIG. 6A, terminal material 580 has substantially the same crystal orientation as III-N material layer 220 (e.g., +c). An amorphous sidewall material 640 may surround terminal material 580 and at least separate terminal material 580 from III-N material layer 220 that has the inverted crystal orientation (e.g., -c). Sidewall material 640 may be any dielectric (e.g., SiO, SiON, SiN). Sidewall material 640 may also be electrically conductive (e.g., a metal) as electrical isolation between terminal material 580 and III-N material layer 230 may be unimportant in the context of light emitter operation. In alternative embodiments where terminal material 580 polycrystalline, or lacks any long-range order, terminal material 580 may be in direct contact with both III-N material layer 220 and 230. Terminal material 580 forms a semiconductor-metal junction with contact metal 590. Contact metal 590 may include any metal known to be suitable for providing a non-rectifying contact (e.g., ohmic or tunneling metal-semiconductor junction) to terminal material 580. In some exemplary embodiments, contact metal 590 includes at least one metal, such as Ni, Pt, Pd, or W.

Each the III-N material layers in light emitter structure 601 may be of a unique III-N alloy composition. Each of the III-N material layers may also be any of those compositions described above in the context of light emitter structures 301 and 501. In the illustrated embodiment however, III-N material layer 220 has the same composition as III-N material layer 230 so that the polarization fields are both P2.

Figure 6B:
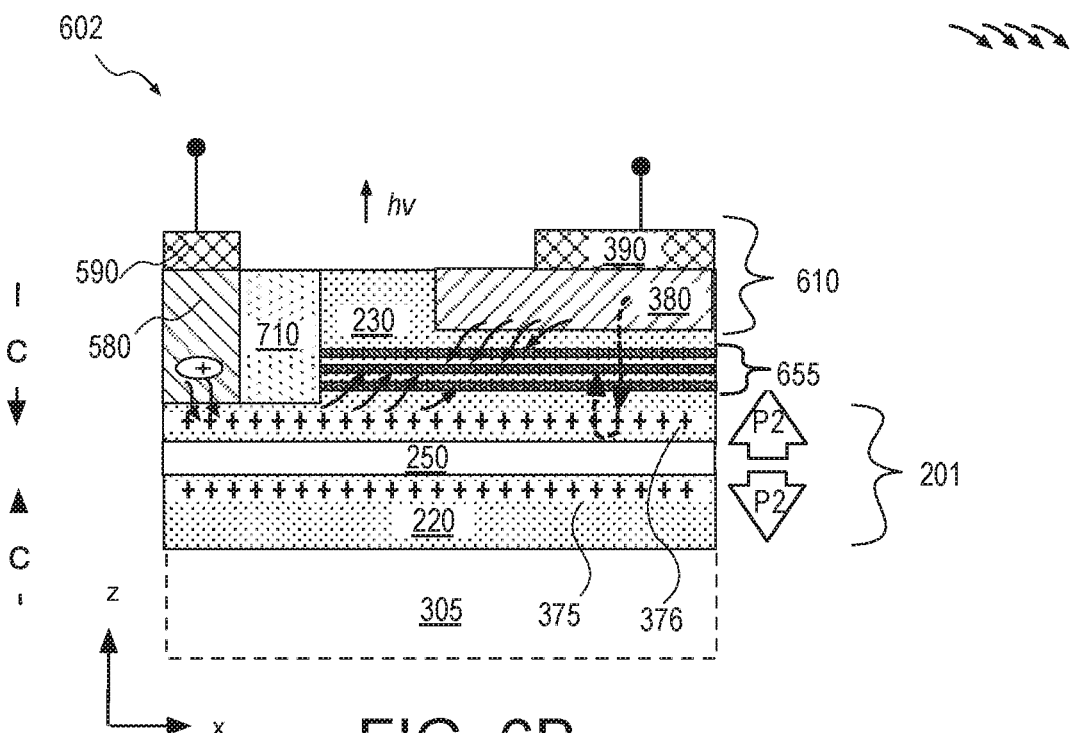
FIG. 6B is a cross-sectional view of a light emitter structure employing a QW structure between a P-type polarization junction and an N-type impurity-doped terminal, in accordance with some alternative embodiments.

FIG. 6B is a cross-sectional view of a light emitter structure 602 employing a QW structure between a P-type polarization junction and an N-type impurity-doped terminal, in accordance with some alternative embodiments. Light emitter structure 602 has a planar architecture with two light emitter terminals on a top side of the QW structure. The QW structure is therefore located between the terminals and a polarization junction with one of the terminals making contact to a charge carrier sheet induced by the polarization junction. The other terminal is coupled to the QW structure through an impurity-doped semiconductor. During operation of a light emitter incorporating light emitter structure 602, current will generally be lateral (e.g., x-dimension) between the contact metallizations 390, 590 and through a thickness of the QW structure on a top side of polarization junction 201. In light emitter structure 602, with the QW structure above intervening material layer 250 charge carrier sheet 376 may be leveraged to inject holes into at least one QW layer 655.

As shown in FIG. 6B, light emitter structure 602 also includes terminal material 380 and a contact metallization 390, which may each have any of the properties described above in the context of FIG. 6A. In this embodiment however, terminal material 380 forms a junction with III-N material layer 230 and may have the same crystal orientation as III-N material layer 230. III-N material layer 230 may again have any of the properties described above (e.g., in the context of FIG. 6A). In the example illustrated in FIG. 6B, III-N material layer 230 has -c polarity and interfaces with intervening material layer 250. Terminal material 380 may also have -c polarity. Alternatively, terminal material 380 may be polycrystalline or amorphous. Within III-N material layer 230, is one or more QW layer 655. QW layer(s) 655 may have any of the properties described above. In the example illustrated in FIG. 6B, QW layer(s) 655 also has -c polarity. Between QW layer(s) 655 and intervening material layer 250, charge carrier sheet 376 resides within a portion of III-N material layer 230. A portion of III-N material layer 230 between terminal material 380 and a first QW layer 655 may have any thickness, but is advantageously less than 10 nm. In some further embodiments, III-N material layer 230 between terminal material 380 and a first QW layer 655 has a thickness less than 10 nm, and advantageously at least 3 nm. A portion of III-N material layer 230 between intervening material layer 250 and a QW layer 655 closest to intervening material layer 250 may also have any thickness, but is advantageously less than 10 nm. In some further embodiments, a portion of III-N material layer 230 between intervening material layer 250 and a QW layer 655 closest to intervening material layer 250 has a thickness of at least 3 nm.

Polarization junction 201 may have any of the properties described above in the context of FIGS. 2 and 3, and may be located over or above any terminal layer 305 known to be suitable for semiconductor light emitter applications. As further illustrated in FIG. 6A, terminal material 580 extends into III-N material layer 230, through QW layer(s) 655, and intersects an area of III-N material layer 230 near where charge carrier sheet 376 (2DHG) resides. This terminal junction therefore scales with the footprint of terminal material 580. An isolation dielectric material 710 laterally (e.g., x-dimension) separates the anode and cathode terminals of light emitter structure 602. Isolation dielectric material 710 may be any material known to be suitable for electrical device isolation, such as any dielectric material used for shallow trench isolation (STI) or interlayer dielectric (ILD) applications. In some embodiments, isolation dielectric material 710 includes both silicon and oxygen (e.g., SiO, SiON, SiOC(H), etc.). Isolation dielectric material 710 extends through the QW layer(s) 655, preventing leakage current that could otherwise bypass QW layer(s) 655.

Each the III-N material layers in light emitter structure 602 may be of a unique III-N alloy composition. Each of the III-N material layers may also be any of those compositions described above in the context of light emitter structures 301 and 501. In the illustrated embodiment however. III-N material layer 220 has the same composition as III-N material layer 230 so that the polarization fields are both P2.

Figure 7:
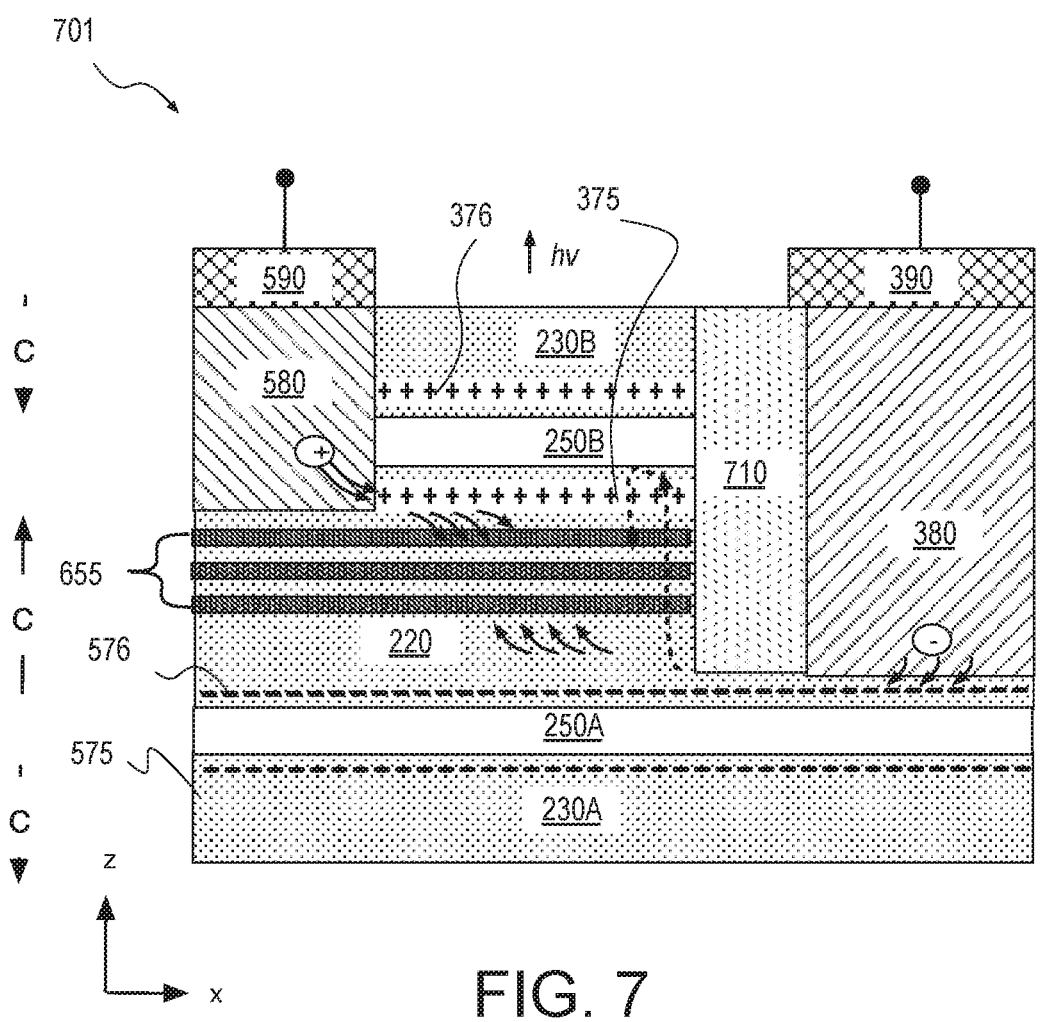
FIG. 7 is a cross-sectional view of a light emitter structure employing a QW structure between two polarization junctions, in accordance with some alternative embodiments.

FIG. 7 is a cross-sectional view of a light emitter structure 701 employing a QW structure between two polarization junctions, in accordance with some embodiments. Light emitter structure 701 replaces an impurity-doped semiconductor terminal of type in light emitter structures 601 and 602 with a second polarization junction. This second polarization junction is of complementary type to that employed in light emitter structures 601 and 602. Hence, as shown in FIG. 7, QW layer(s) 655 are located between two complementary polarization junctions. The heterostructure stack employed in light emitter structure 701 is therefore a stack of the light emitter structure 301 over light emitter structure 501. These two structures introduced separately above are stacked to share one QW structure. The reference numbers introduced in the context of FIG. 2-FIG. 6B are retained in light emitter structure 701 for material layers that may have any of the properties as described for those layers above. As further shown, for example, the N-face of III-N material layer 220 forms polarization junction 401. The Group III-face of III-N material layer 220 forms polarization junction 201. In FIG. 7, the suffixes "A" and "B" are added to reference numbers to emphasize how polarization junctions 201 and 401 are incorporated into light emitter structure 701. Material layers with reference numbers ending with "A" and "B" may have any of the properties described for material layers of the same root reference number. Hence, for light emitter structure 701 intervening material layers 250A and 250B may both have any of the properties described above for intervening material layer 250. Likewise III-N material layers 230A and 230B may both have any of the properties described above for III-N material layer 230.

Each the III-N material layers in light emitter structure 701 may be of a unique III-N alloy composition. Each of the III-N material layers may also be any of those compositions described above in the context of light emitter structures 301 and 501. In one exemplary embodiment however, III-N material layer 220 has the same composition as III-N material layers 230A and 230B located on opposite faces of III-N material layer 220 so the polarization fields are all P2. In some embodiments, III-N material layer 220 and III-N material layers 230A and 230B are all binary GaN. III-N material layer 220 and III-N material layers 230A and 230B may also all be doped or undoped (i.e., not intentionally doped with donor or acceptor impurities).

Light emitter structure 701 includes a first (bottom) III-N material layer 230A that is over any suitable substrate (not depicted). III-N material layer 220 is above a first (bottom) intervening material layer 250A that is over the first III-N material layer 230A. III-N material layer 220 includes a QW structure (e.g., QW layers 655). Another intervening material layer 250B is over III-N material layer 220. Another (top) III-N material layer 230B is over intervening material layer 250B. Within light emitter structure 701, III-N material layer 220 may be operative as an intrinsic (i) layer of a diode with p-type and n-type junctions at opposite faces of III-N material layer 220. III-N material layer 220 should be of sufficient thickness to avoid band-to-band tunneling between 2DHG 375 and 2DEG 576. In some embodiments, III-N material layer 220 has a thickness greater than that of at least one of III-N material layers 230A and 230B. In some embodiments, III-N material layer 220 has a thickness greater than that of each of III-N material layers 230A and 230B. In some exemplary embodiments, III-N material layer 220 is no more than 30 nm in thickness (e.g., along c-axis), while the thicknesses of III-N material layers 230A and 230B may each vary as described above for III-N material layer 220. In the illustrated embodiment, each of the depicted layers are in direct contact with the material layer above and below. However, one or more other material layers (not depicted) may be inserted between various ones of the illustrated layers. Furthermore, an architecture functionally similar to light emitter structure 701 may be implemented by laterally arranging these same materials into a horizontal layout rather than the vertical layout shown.

Semiconductor terminal materials 380 and 580 both extend through one of the polarization junctions. Terminal material 380 extends through, or is adjacent to, a sidewall of III-N material layer 230B, intervening material layer 250B, and QW layer(s) 655. Terminal material 380 intersects an area of III-N material layer 220 proximal (e.g., within a few nanometers) to negative charge carrier sheet 576. Electrical coupling to charge carrier sheet 576 is therefore a function of the lateral area (e.g., footprint) of terminal material 380. Terminal 580 extends through, or is adjacent to, a sidewall of, III-N material layer 230B, intervening material layer 250B, and a portion of III-N material layer 220 where charge carrier sheet 375 resides. Electrical coupling to charge carrier sheet 375 is therefore a function of the sidewall surface area forming a junction with a sidewall of III-N material layer 220 where charge carrier sheet 375 resides. As described above, terminal layer 380 may be doped with donor impurities (e.g., Si) while terminal layer 580 may be doped with acceptor impurities (e.g., Mg). Contact metals 390 and 590 may be any of suitable composition, for example having any of the compositions described above.

Light emitter structure 701 has the advantage of high negative and positive charge densities resulting from the polarization properties of the III-N material system. These high charge densities are concentrated in only a few nanometers of film thickness at the opposite faces of III-N material layer 220. Charge induction for light emitter structure 701 is therefore not dependent on impurity dopant concentration. The functional role of any doped material layers (e.g., terminal layers 380 and 580) within light emitter structure 701 is limited to providing a terminal junction. Light emitter structure 701 also has the advantage of carrier blocking by intervening material layers 250A and 250B located on both sides of the QW structure. Carriers may therefore be confined to reduced non-radiative recombination. Light emitter structure 701 also has carrier injection that avoids the blocking effect of the intervening material layers.

Light emitters employing polarization junctions, such as light emitter structures 301, 501, 601, 602, or 701, may be implemented as discrete devices or, monolithically integrated into an integrated circuit (IC) that further includes other devices, such as, but not limited to transistors. Such transistors may, for example, also be implemented in the III-N material system. For example, an IC may include one or more III-N heterojunction field effect transistors (HFETs) electrically interconnected with one or more III-N polarization junction diodes. Such HFETs may rely on polarization layers, or also employ polarization junction. In some embodiments where the NMOS HFET structure includes a polarization layer, the polarization layer is deposited over one of the III-N material layers employed in a light emitter structure. For example, the polarization layer may be deposited on III-N material layer 220 or III-N material layer 230. Such a polarization layer may be a III-N material having the same crystal polarity as III-N material layer 220 or III-N material layer 230 to which the polarization layer contacts. In some exemplary embodiments, the polarization layer composition is sufficiently different from that of the III-N material layer 220 and III-N material layer 230 to induce a charge carrier sheet (e.g., 2DEG) within the III-N material layer 220 and III-N material layer 230. The HFET therefore may share at least one of III-N material layer 220 and III-N material layer 230 with a light emitter structure.

The HFET may further include a gate stack (e.g., a gate electrode separated from the III-N material layer 220 and III-N material layer 230 by a gate dielectric), and a source and a drain on opposite sides of the gate stack according to any III-N HFET architecture as embodiments herein are not limited in this respect. The polarization layer is located between the gate and each of the source and the drain to induce a charge carrier sheet that couples the source and drain together under suitable gate bias. The HFET source or drain may be of the same III-N material as one of the III-N terminal materials employed by polarization diodes described above, for example. In other embodiments, an IC may include one or more silicon metal-oxide-semiconductor (MOS) FETs electrically interconnected with one or more III-N polarization junction diodes. Such silicon-based MOS-FETs may have any device architecture known in the art as embodiments herein are not limited in this respect.

Figure 8:
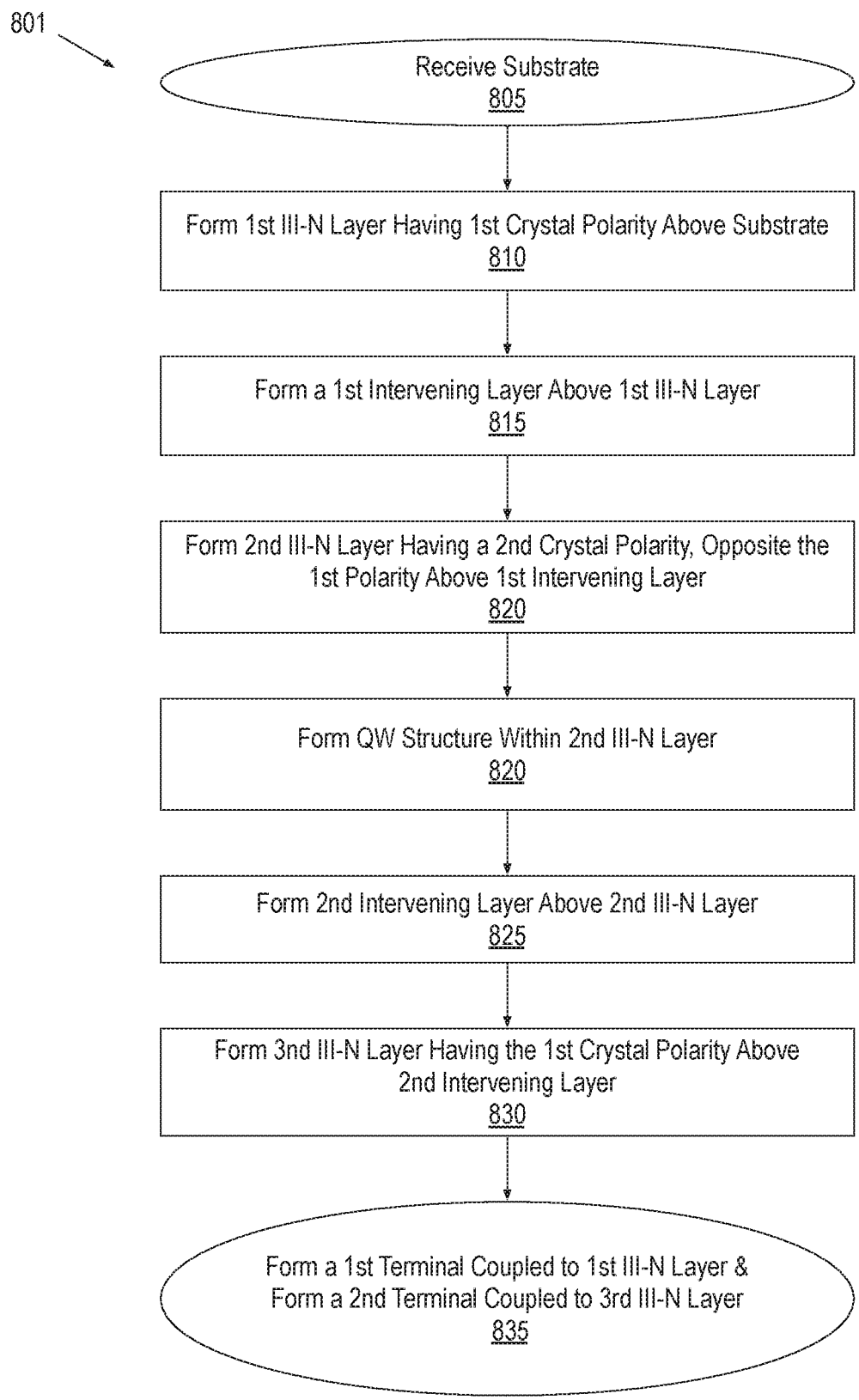
FIG. 8 is a flow diagram illustrating methods of forming a light emitter, in accordance with some embodiments.

The semiconductor light emitter structures described above may be fabricated using a variety of methods. FIG. 8 is a flow diagram illustrating methods 801 for forming a III-N polarization junction diode, in accordance with some illustrative embodiments. Methods 801 begin at operation 805 where a substrate including a crystalline seed layer is received. The substrate received at operation 805 may be any suitable for epitaxial growth of a III-N material stack, for example. The substrate received at operation 805 may, but need not, include one or more terminal material layers to which a contact may be subsequently formed.

At operation 810, an epitaxial growth process is employed to form a III-N material layer having a first crystal polarity on the substrate seeding surface. Such epitaxial growth may form a continuous crystal over an entire surface of a substrate, or may be limited to crystalline islands or mesas occupying only a portion of a substrate surface as controlled through a templating pattern. Polarity of the crystal growth may be controlled through growth conditions, for example by introducing precursors under growth conditions (e.g., temperature and partial pressures) that favor nucleation having either −c or +c polarity out of the plane of the seeding substrate surface. One or more III-N material layers having the first crystal polarity may be grown at operation 810. In the example shown in FIG. 9A, III-N material layer 230A is grown with (−c) polarity out of the plane of substrate 901. III-N material layer 230A may have any of the compositions described above. For example, terminal material 380 may be an impurity-doped III-N material while III-N material layer 230A is intrinsic binary GaN. III-N material layer 230A may be epitaxially grown over a substrate 901 with any growth technique(s) known to be suitable for III-N crystals, such as, but not limited to, metal-organic chemical vapor deposition (MOCVD), vapor phase epitaxy (VPE), or molecular beam epitaxy (MBE). In some embodiments, elevated temperatures of 600° C., or more, are employed. The growth of III-N material layer 230A may include deposition of a nucleation layer (not depicted), such as AlN, and further include growth of intrinsic GaN using predetermined epitaxial growth conditions (e.g., a first growth pressure, a first growth temperature, a first V/III growth precursor ratio).

Figure 9A:
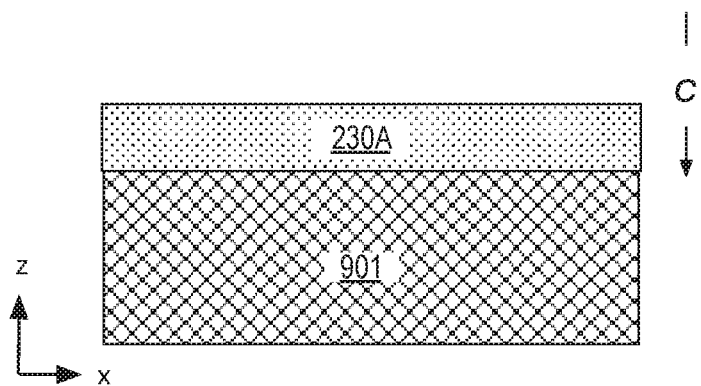
FIGS. 9A, 9B, 9C, 9D, 9E, 9F, 9G, and 9H are cross-sectional views of a light emitter evolving as selected operations in the methods illustrated in FIG. 8 are performed, in accordance with some embodiments.

In further reference to FIG. 9A, substrate 901 may include any suitable material or materials. For example, substrate 901 may have cubic crystallinity with a predetermined crystal orientation (e.g., (100), (111), (110), or the like). For such embodiments, template structures may be formed on a cubic substrate surface, such as a (100) surface. III-N crystals may also be grown on other surfaces (e.g., 110, 111, miscut or offcut, for example 2-10° toward (110), etc.). In some such examples, substrate 901 includes a semiconductor material such as monocrystalline silicon (Si), germanium (Ge), silicon germanium (SiGe). Other crystalline materials, such as, but not limited to, gallium arsenide (GaAs), or silicon carbide (SiC), sapphire ($Al_2O_3$) are also suitable as a growth surface of substrate 901. In some examples, substrate 901 includes silicon having a (100) crystal orientation with a 4°-11° miscut (with 4-6° being particularly advantageous). In other examples, substrate 901 includes silicon with a crystal orientation of (111), which may offer the advantage of a smaller lattice mismatch with III-N materials than (100) or (110) silicon surfaces. Substrate 901 may include one or more buffer layers of III-N material. Substrate 901 may also include a host substrate material upon which a III-N crystal has been bonded, in which case the host substrate may be crystalline, or not (e.g., glass, polymer, etc.). In various examples, substrate 901 may include metallization interconnect layers for integrated circuits or electronic devices such as transistors, memories, capacitors, resistors, optoelectronic devices, switches, or any other active or passive electronic devices separated by an electrically insulating layer, for example, an interlayer dielectric, or the like.

Figure 9B:
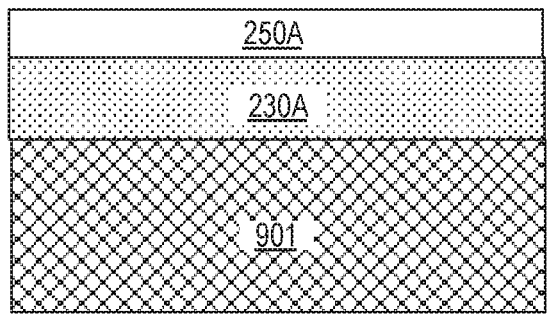

Returning to FIG. 8, methods 801 continue at operation 815 where a first intervening material layer is formed above the III-N material layer having the first crystal polarity. As noted above, the intervening material layer is to decouple the crystal polarity of two adjacent III-N material layers and thereby facilitate a polarity inversion. In some embodiments, operation 815 entails an epitaxial growth of a precursor material that is suitable as a nucleation layer for III-N epitaxial growths. In the example shown in FIG. 9B, intervening material layer 250A may have been epitaxially grown or deposited (e.g., by atomic layer deposition) directly on the III-N material layer 230A. Such a precursor material may also have the first crystal polarity, for example, or an alternative crystal polarity, or alternative crystallinity (e.g., trigonal or cubic), or may be amorphous in the as-deposited state. In some embodiments, operation 815 further entails an oxidation of the precursor material epitaxially grown over the III-N material layer. For example, a binary AlN layer with the first crystal polarity may be grown at operation 815 and then subsequently oxidized, for example with any in-situ or ex-situ oxidation technique known to be suitable for at least a surface of a crystalline or amorphous AlN layer. If the AlN is amorphous as-deposited, a thermal process may be performed before or after oxidation to at least partially melt the amorphous material and induce crystallization. This oxidized surface (e.g., $Al_xO_y$) may then be advantageous for inverting the polarity of III-N material during subsequent epitaxial growth processes. Similar growth and oxidation processes may also be performed to form other material compositions, such as, but not limited to, $Sc_xO_y$, or AlScO.

In some alternative embodiments, operation 815 includes the deposition of an amorphous or polycrystalline material that is suitable as a bonding layer between two III-N material layers. Any deposition process known to be suitable for any of the exemplary materials described above may be employed to form the amorphous or polycrystalline intervening material layer over. For example, chemical vapor deposition (CVD), plasma-enhanced CVD (PECVD), or atomic layer deposition (ALD) may be employed at operation 815 to deposit a silicon oxide, or any of the high-k materials described above.

Figure 9C:
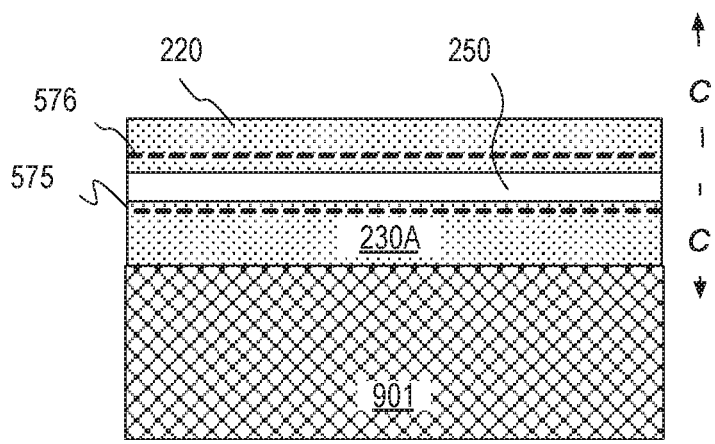

Methods 801 continue at operation 820 where a III-N layer having a second crystal polarity, substantially opposite to, or inverted from, the first crystal polarity is formed above the intervening material layer deposited at operation 815. In the example shown in FIG. 9C, III-N material layer 220 has been formed directly on intervening material layer 250A. Polarity of the crystal growth at operation 820 may be controlled through growth conditions, for example by introducing precursors under growth conditions (e.g., temperature and partial pressures) that favor nucleation having either −c or +c polarity out of the plane of the seeding substrate surface. One or more III-N material layers having the second crystal polarity may be grown at operation 820. In the example shown in FIG. 9C, III-N material layer 220 is grown with (+c) polarity out of the plane of substrate 901. In some embodiments where operation 820 entails the growth of multiple III-N material layers, both a nucleation layer and a bulk III-N layer of greater thickness are epitaxially grown. For example, a nucleation layer of a material other than binary GaN (e.g., AlN) may be epitaxially grown on the intervening material layer (e.g., $Al_xO_y$). With proper growth conditions, the nucleation layer may initiate epitaxial growth with the desired (+c) polarity, and operation 820 may continue with the growth of any additional III-N material (e.g., binary GaN). The epitaxial growth of III-N material layer 220 may be terminated upon reaching a desired target thickness. As shown in FIG. 9C, polarization doping (e.g., 2DEGs 575, 576) occurs upon the formation of III-N material layer 220.

In alternative embodiments, for example where an amorphous or polycrystalline intervening material layer was deposited or otherwise formed at operation 815, layer transfer and/or wafer bonding processes may be practiced at operation 820. For example, one or more crystalline III-N material layers having the desired second crystal polarity may be provided on a sacrificial substrate. The sacrificial substrate may be, for example, any of the materials described above for substrate 901. In one such embodiment, a III-N material having a desired composition is grown with (−c) polarity over the sacrificial substrate. This structure is then inverted to mate a surface of this III-N material to a surface of the intervening material layer, thereby providing the desired (−c) to (+c) polarity inversion. The sacrificial substrate may then be removed, if desired.

Returning to FIG. 8, methods 801 continue at operation 825 where another intervening material layer is formed over the III-N layer having the second crystal polarity. As noted above, this second intervening material layer is also to decouple the crystal polarity of two adjacent III-N material layers and thereby facilitate another polarity inversion, substantially in the same manner as the first inversion. In some embodiments, operation 825 entails an epitaxial growth of a material that is suitable as a nucleation layer for further III-N epitaxial growths. In some embodiments, operation 825 is the same as operation 815. Methods 801 then continue at operation 830 where a third III-N layer having crystal polarity inverted from the second polarity (i.e., inverted back to the first polarity) is formed above the intervening material layer that was formed at operation 825.

Figure 9D:
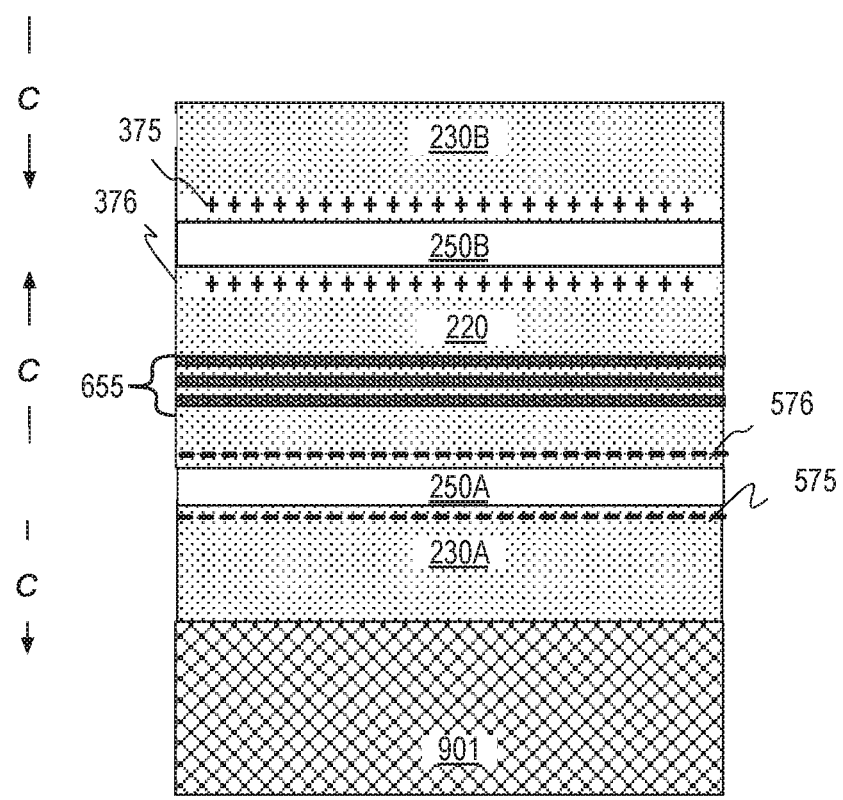

In the example shown in FIG. 9D, any of the materials described above may be epitaxially grown or deposited (e.g., by atomic layer deposition) directly on the III-N material layer 220. As deposited, this material may also have the second crystal polarity, for example. In some embodiments, operation 825 further entails an oxidation of precursor material epitaxially grown over the III-N material layer having the second crystal polarity, the first polarity, alternative polarity, or other crystallinity (e.g., trigonal or cubic), or may be amorphous in the as-deposited state. For example, a binary AlN layer with the second crystal polarity may be grown at operation 825 as a precursor material and subsequently oxidized, for example with any in-situ or ex-situ oxidation technique known to be suitable for oxidizing at least a surface of a crystalline or amorphous AlN layer. If the AlN is amorphous as-deposited, a thermal process may be performed before or after oxidation to at least partially melt the amorphous material and induce crystallization. This oxidized surface (e.g., $Al_xO_y$) may then be advantageous for inverting the polarity of III-N material during subsequent epitaxial growth processes. Similar growth and oxidation processes may also be performed to form other material compositions, such as, but not limited to $Sc_xO_y$, or AlScO.

In some alternative embodiments, operation 825 includes the deposition of an amorphous or polycrystalline material that is suitable as a bonding layer between two III-N material layers. Any deposition process known to be suitable for any of the exemplary materials described above may be employed to form an amorphous or polycrystalline intervening material layer over. For example, chemical vapor deposition (CVD), plasma-enhanced CVD (PECVD), or atomic layer deposition (ALD) may be employed at operation 825 to deposit a silicon oxide, or any of the high-k materials described above.

In the example shown in FIG. 9D, III-N material layer 230B has been formed directly on intervening material layer 250B. Polarity of the crystal growth may be controlled through growth conditions, for example by introducing precursors under growth conditions (e.g., temperature and partial pressures) that favor nucleation having either −c or +c polarity out of the plane of the seeding substrate surface. One or more III-N material layers having the first crystal polarity may be grown at operation 830. In the example shown in FIG. 9D, III-N material layer 230B is grown with (−c) polarity out of the plane of intervening material layers 250A, 250B and/or substrate 901. In some embodiments where operation 830 entails the growth of multiple III-N material layers, both a nucleation layer and a bulk III-N layer of greater thickness are epitaxially grown. For example, a nucleation layer of a material other than binary GaN (e.g., AlN) may be epitaxially grown on the intervening material layer (e.g., $Al_xO_y$). With proper growth conditions, the nucleation layer may initiate epitaxial growth with the desired (−c) polarity, and operation 830 may continue with the growth of any additional III-N material (e.g., binary GaN). The epitaxial growth of III-N material layer 230B may be terminated upon reaching a desired target thickness. As shown in FIG. 9D, polarization doping (e.g., 2DHGs 575, 576) occurs upon the formation of III-N material layer 220B.

In alternative embodiments, for example where an amorphous or polycrystalline intervening material layer was deposited or otherwise formed at operation 825, layer transfer and/or wafer bonding processes may be practiced at operation 830. Such bonding and/or layer transfer may proceed as a second iteration of a bonding/transfer process performed at operation 815. Alternatively a stack of material layers including a polarization junction fabricated upstream by any means may be transferred and/or bonded at operation 815 or operation 830 to arrive at the same final structure. For example, one or more crystalline III-N material layers having the desired first crystal polarity may be provided on a sacrificial substrate. The sacrificial substrate may be, for example, any of the materials described above for substrate 901. In one such embodiment, a III-N material having a desired composition is grown with (+c) polarity over the sacrificial substrate. This structure is then inverted to mate a surface of this III-N material to a surface of the intervening material layer, thereby fabricating in the desired (+c) to (−c) polarity inversion. The sacrificial substrate may then be removed.

Returning to FIG. 8, methods 801 complete at operation 835 where one or more interconnect levels, for example including light emitter contact metallization, are formed using any techniques known to be suitable for the purpose. For embodiments where the light emitter structures are to be monolithically integrated into an IC, any known back-end-of-line (BEOL) processing may be performed at operation 835 to complete the IC. Following operation 835, an IC including III-N polarization junction light emitters, or discrete III-N polarization junction light emitters are substantially complete and may be singulated and packaged following any suitable techniques.

Figure 9E:
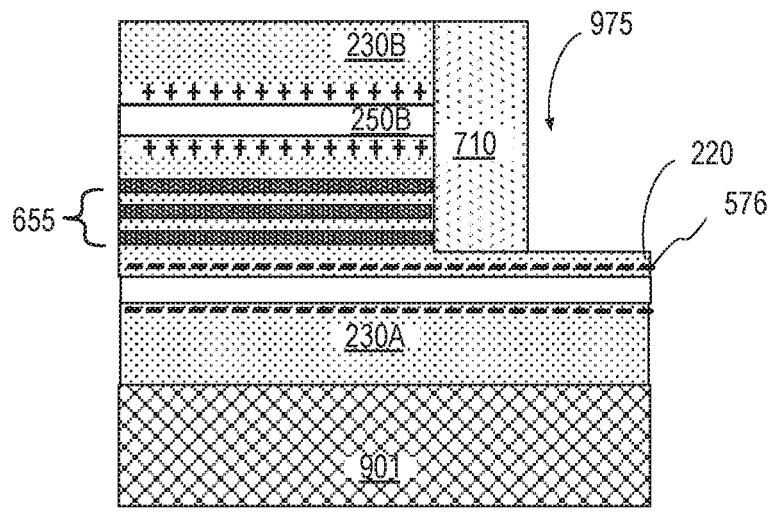

As further shown in FIG. 9E, a trench 975 is etched through III-N material layer 230B, through intervening material layer 250B, and partially through III-N material layer 220 at least to the extent that the QW layer(s) 655 are etched through. One or more etch processes suitable for the material compositions may be utilized to form trench 975. Trench 975 is then at least partially backfilled with isolation dielectric material 710. In some embodiments, trench 975 is completely backfilled with isolation dielectric material 710, for example using any STI process where a polish planarizes a top surface of isolation dielectric material 710 with III-N material layer 230B. Alternatively, trench 975 is only partially backfilled with isolation dielectric material 710, for example using a conformal dielectric deposition process followed by an anisotropic dielectric etch process to form a sidewall spacer of isolation dielectric material 710, as illustrated in FIG. 9E.

Figure 9F:
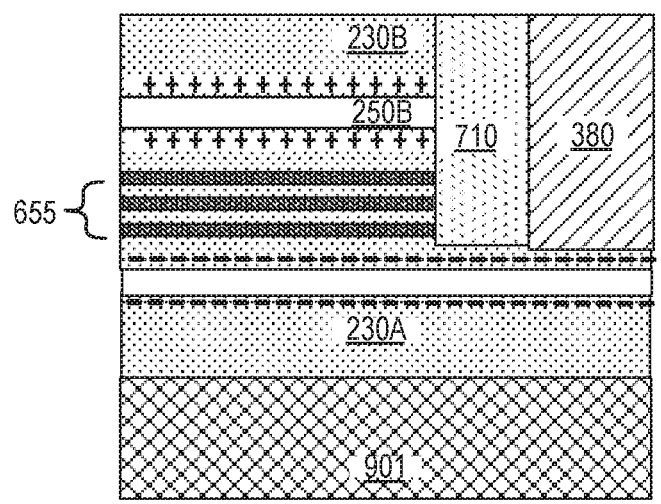

As further shown in FIG. 9F, terminal material 380 is deposited and/or grown from within a remainder of trench 975. For alternative embodiments where trench 975 is completely backfilled with isolation dielectric material 710, another (second) trench may be etched through III-N material layer 230B, through intervening material layer 250B, and partially through III-N material layer 220. This second trench may then be backfilled with terminal material 380 to arrive at a similar structure. In still other embodiments, a portion of isolation dielectric material 710 occupying trench 975 is etched to re-expose a portion of III-N material layer 220. This opening is then backfilled with terminal material 380.

Figure 9G:
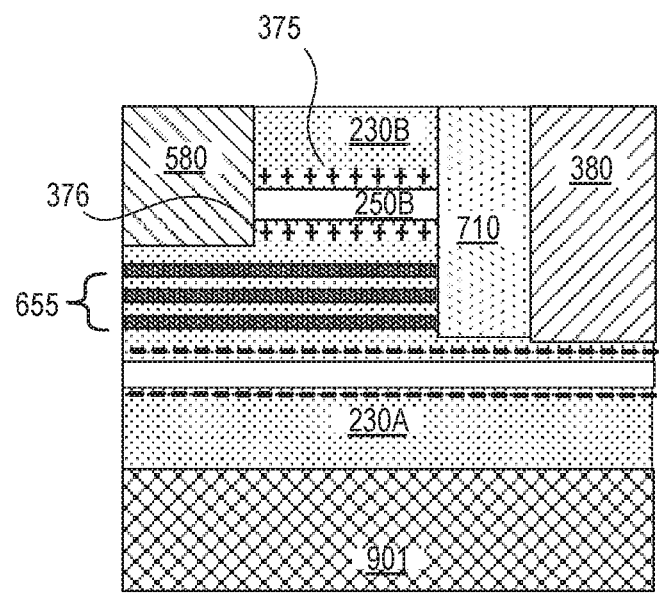
Figure 9H:
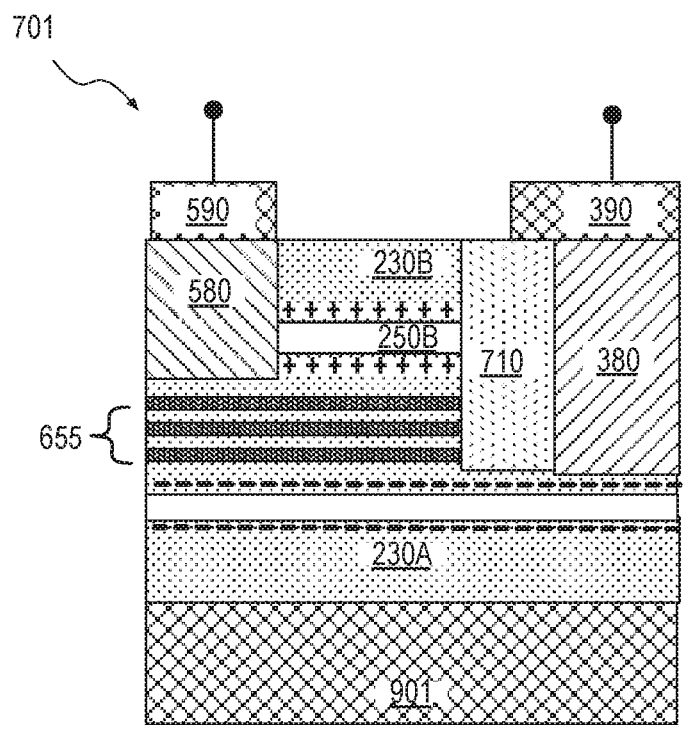

As further shown in FIG. 9G, another trench is then etched through the III-N material layer 230B, through intervening material layer 250B, and partially through III-N material layer 220 to the extent that a sidewall of III-N material layer 220 where the carrier sheet 375 is exposed. One or more etch processes suitable for the material compositions may be employed for this etch. Relative to trench 975 (FIG. 10B), the thickness of III-N material layer 220 removed is less. Terminal material 380 is then deposited and or grown within this trench. One or more planarization processes (e.g., a polish) may be performed to planarize a top surface of terminal materials 380, 580 with a top surface of III-N material layer 230B. Contact metallization may then be deposited an patterned according to any suitable techniques known in the art to arrive at the light emitter structure 701, as shown in FIG. 9H, and as discussed above in the context of FIG. 7.

Figure 10:
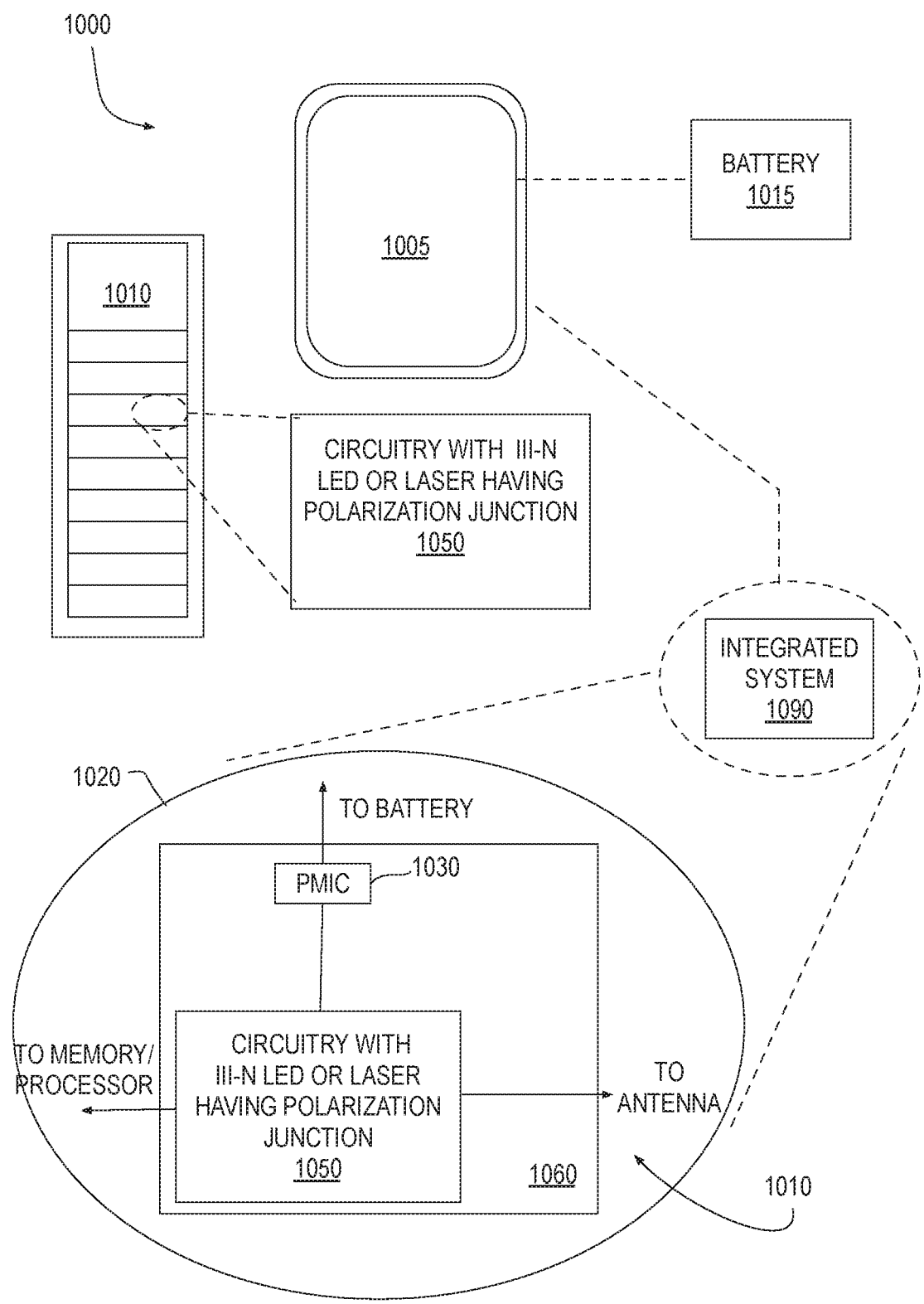
FIG. 10 illustrates a mobile computing platform and a data server machine employing an IC including a light emitter, in accordance with embodiments.

FIG. 10 illustrates a system 1000 in which a mobile computing platform 1005 or a data server machine 1010 employs an circuitry including at least one III-N polarization junction light emitter, in accordance with some embodiments. The server machine 1010 may be any commercial server, for example including any number of high-performance computing platforms disposed within a rack and networked together for electronic data processing, which in the exemplary embodiment includes circuitry 1050. In accordance with mobile embodiments of system 1000, mobile computing platform 1005 may be any portable device configured for each of electronic data display, electronic data processing, wireless or optical electronic data transmission, or the like. For example, the mobile computing platform 1005 may be any of a tablet, a smart phone, laptop computer, etc., and may include a display screen (e.g., a capacitive, inductive, resistive, or optical touchscreen), a chip-level or package-level integrated system 1090, and a battery 1015.

Whether disposed within the integrated system 1090 illustrated in the expanded view 1020, or as a stand-alone packaged chip within the server machine 1010, an IC is electrically coupled to at least one III-N polarization junction light emitter, for example as describe elsewhere herein. The circuitry 1050 may be further affixed to a board, a substrate, or an interposer 1060 along with a power management integrated circuit (PMIC). Functionally, PMIC 1030 may perform batten power regulation, DC-to-DC conversion, etc., and so has an input coupled to battery 1015 and with an output providing a current supply to other functional modules.

Circuitry 1050, in some embodiments, includes RF (wireless) integrated circuitry (RFIC) further including a wideband RF (wireless) transmitter and/or receiver (TX/RX transceiver including a digital baseband and an analog front end module comprising a power amplifier on a transmit path and a low noise amplifier on a receive path). The RFIC includes at least one III-N heterostructure transistor or diode. The RFIC has an output coupled to an antenna (not shown) to implement any of a number of wireless standards or protocols, including but not limited to Wi-Fi (IEEE 802.10 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Circuitry 1050, in some embodiments, includes an optical transmitter and/or receiver (TX/RX transceiver) including a III-N polarization junction light emitter.

Figure 11:
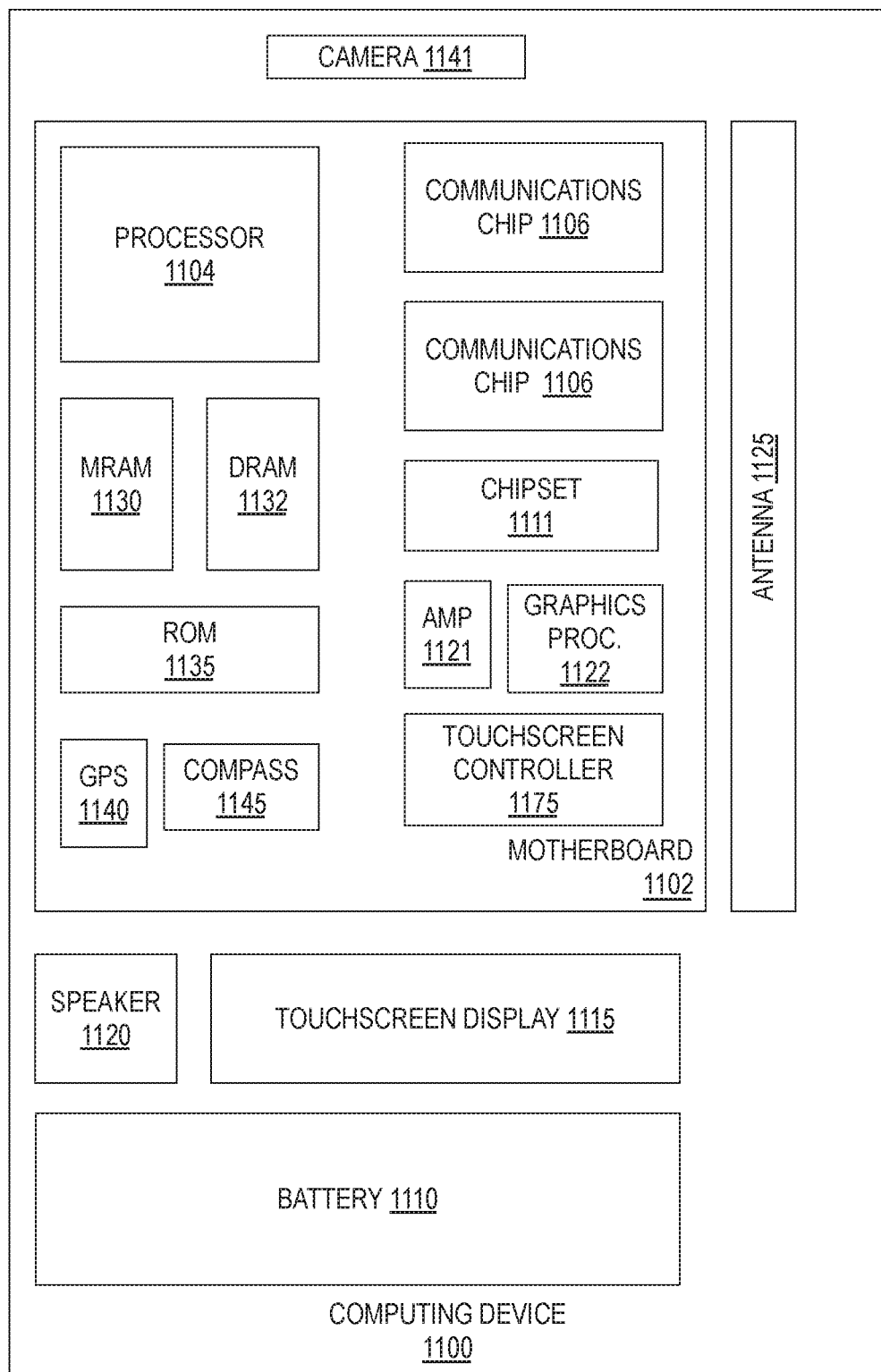
FIG. 11 is a functional block diagram of an electronic computing device, in accordance with some embodiments.

FIG. 11 is a functional block diagram of a computing device 1100, arranged in accordance with at least some implementations of the present disclosure. Computing device 1100 may be found inside platform 1005 or server machine 1010, for example. Device 1100 further includes a motherboard 1102 hosting a number of components, such as, but not limited to, a processor 1104 (e.g., an applications processor), which may further include at least one III-N polarization junction diode, in accordance with embodiments of the present invention. Processor 1104 may for example include power management integrated circuitry (PMIC) that includes at least one III-N polarization junction diode. Processor 1104 may be physically and/or electrically coupled to motherboard 1102. In some examples, processor 1104 includes an integrated circuit die packaged within the processor 1104. In general, the term "processor" or "microprocessor" may refer to any device or portion of a device that processes electronic data from registers and/or memory to transform that electronic data into other electronic data that may be further stored in registers and/or memory.

In various examples, one or more communication chips 1106 may also be physically and/or electrically coupled to the motherboard 1102. In further implementations, communication chips 1106 may be part of processor 1104. Depending on its applications, computing device 1100 may include other components that may or may not be physically and electrically coupled to motherboard 1102. These other components include, but are not limited to, volatile memory (e.g., MRAM 1130, DRAM 1132), non-volatile memory (e.g., ROM 1135), flash memory, a graphics processor 1122, a digital signal processor, a crypto processor, a chipset, an antenna 1125, touchscreen display 1115, touchscreen controller 1175, battery 1110, audio codec, video codec, power amplifier 1121, global positioning system (GPS) device 1140, compass 1145, accelerometer, gyroscope, audio speaker 1120, camera 1141, and mass storage device (such as hard disk drive, solid-state drive (SSD), compact disk (CD), digital versatile disk (DVD), and so forth), or the like.

Communication chips 1106 may enable wireless communications for the transfer of data to and from the computing device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1106 may implement any of a number of wireless standards or protocols, including but not limited to those described elsewhere herein. As discussed, computing device 1100 may include a plurality of communication chips 1106. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the invention is not limited to the embodiments so described, but can be practiced with modification and alteration without departing from the scope of the appended claims. For example the above embodiments may include specific combinations of features as further provided below.

In one or more examples, a light emitter structure, comprises a quantum well (QW) structure with a first layer comprising a Group III-nitride (III-N) material having a first crystal polarity. The light emitter structure has a second layer comprising a III-N material having a second crystal polarity, inverted from the first crystal polarity. The light emitter structure has an intervening material layer between the QW structure and the second layer, wherein the intervening material layer comprises other than a III-N material. A first contact and a second contact is electrically coupled across the QW structure.

In one or more second examples, for any of the first examples, the first contact is electrically coupled to the first layer through a terminal layer comprising a III-N alloy and having a higher concentration of acceptor impurities than the first layer, and the QW structure is between the intervening material layer and the second contact.

In one or more third examples, for any of the first through the second examples, a sidewall of the terminal material contacts a sidewall of the first layer proximal to a positive charge carrier sheet that is near the interface of the first layer and the intervening material layer.

In one or more fourth examples, for any of the first through the third examples the QW structure comprises the first layer and one or more QW layers having a bandgap smaller than that of the first layer. The first contact is electrically coupled to the first layer through a first terminal material comprising a III-N alloy having a higher concentration of acceptor impurities than the first layer. The second contact is electrically coupled to the second layer through a second terminal material comprising a III-N alloy having a higher concentration of donor impurities than the second layer. An isolation dielectric material laterally separates the first terminal material from the second terminal material, from the second layer, and from the QW layers.

In one or more fifth examples, for any of the first through the fourth examples, a bottom of the first III-N terminal material contacts an area of a positive charge carrier sheet that is near the interface of the first layer and the intervening material layer.

In one or more sixth examples, for any of the second examples the light emitter structure further comprises a third layer comprising a III-N material having the second crystal polarity, a second intervening between the first layer and the third layer, wherein the second intervening material layer comprises other than a III-N material. The second contact is coupled to a negative charge carrier sheet that is near the interface of the first III-N material and the second intervening material layer through a second terminal material comprising a III-N alloy having a higher concentration of donor impurities than the first layer.

In one or more seventh examples, for any of the sixth examples a group III-face of the first layer is adjacent to one of the intervening material layers and a nitrogen (N)-face of the second layer is adjacent to another of the intervening material layers. A group III-face of the second layer is facing the group III-face of the first layer. A nitrogen (N)-face of the third layer is facing the nitrogen (N)-face of the third layer.

In one or more eighth examples, for any of the seventh examples a c-axis of the first, second and third layers is oriented substantially normal to a plane of the intervening material layers with polar faces of the first, second, and third layers separated by the intervening material layers.

In one or more ninth examples, for any of the seventh examples at least the first and third layers comprise the same III-N material, the terminal material has a higher concentration of Indium than the first and third layers.

In one or more tenth examples, for any of the sixth through ninth examples, a first terminal material comprising a III-N alloy contacts a sidewall of the first layer proximal to a positive charge carrier sheet of a first polarization junction near the intervening material layer. The second terminal material comprising a III-N alloy contacts a surface of the first layer proximal to a negative charge carrier sheet of a second polarization junction near the second intervening material layer.

In one or more eleventh examples, for any of the first through the tenth examples, the light emitter structure further comprises an isolation dielectric material between the first and second terminal materials, wherein the isolation dielectric material extends through the first polarization junction but not the second polarization junction.

In one or more twelfth examples, for any of the first through the eleventh examples, the first layer is binary GaN.

In one or more thirteenth examples, for any of the first through the twelfth examples the intervening material layers each have a thickness no more than 5 nm.

In one or more fourteenth examples, for any of the first through the thirteenth examples the intervening material layers each comprise oxygen and at least one of a metal, a rare earth, or a lanthanide.

In one or more fifteenth examples, for any of the first through the fourteenth examples the intervening material layers are crystalline.

In one or more sixteenth examples, for any of the first through the fifteenth examples the intervening material layers are amorphous.

In one or more seventeenth examples, a computer platform includes a processor, and one or more optical transceiver coupled to the processor, wherein the optical transceiver includes a light emitter. The light emitter comprises a quantum well (QW) structure with a first layer comprising a Group III-nitride (III-N) material having a first crystal polarity. The light emitter comprises a second layer comprising a III-N material having a second crystal polarity, inverted from the first crystal polarity. The light emitter comprises an intervening material layer between the QW structure and the second layer, wherein the intervening material layer comprises other than a III-N material. The light emitter comprises a first contact and a second contact electrically coupled across the QW structure.

In one or more eighteenth examples, the computer platform comprises a battery coupled to at least one of the processor and RF transceiver.

In one or more nineteenth examples, a method of forming a light emitter, the method comprises epitaxially growing a quantum well (QW) structure over a crystalline seed layer, wherein the QW structure has a first layer comprising a Group III-nitride (III-N) material of a first crystal polarity, and one or more QW layers having a bandgap smaller than that of the first layer. The method comprises depositing, over the QW structure, an intervening material layer comprising other than a III-N material. The method comprises forming, over the first intervening material layer, a second layer comprising a III-N material having a second crystal polarity, opposite the first polarity. The method comprises forming a first contact to a positive charge carrier sheet of a polarization junction near the intervening material layer. The method comprises forming a second contact to a III-N material separated from the first layer by the one or QW layers.

In one or more twentieth examples, the method further comprises forming a third layer comprising a III-N material of the first crystal polarity, depositing, over the third layer, a second intervening material layer comprising other than a III-N material. The QW structure is grown over the second intervening material layer.

In one or more twenty-first examples, for any of the nineteenth through twenty-first examples forming at least one of the first and second intervening material layers further comprises epitaxially depositing a precursor material layer comprising Al, and oxidizing the precursor material layer.

In one or more twenty-second examples, for any of the nineteenth through twenty-first examples forming at least one of the first and second intervening material layers further comprises chemical vapor deposition of an amorphous material, and forming the first layer further comprises bonding a III-N material to the amorphous material.

In one or more twenty-third examples for any of the nineteenth through twenty-second examples forming the first contact further comprises exposing a positive charge carrier sheet that is near the interface of the first layer and the intervening material layer by forming a first opening through the second layer and through the first intervening material layer. Forming the first contact further comprises epitaxially growing a first terminal material comprising p-type $In_xGa_{1-x}N$ within the first opening. Forming the second contact further comprises exposing a negative charge carrier sheet that is near the interface of the first layer and the second intervening material layer by forming a second opening through the second layer and through the first intervening material layer. Forming the second contact further comprises epitaxially growing a second terminal material comprising n-type $In_xGa_{1-x}N$ within the second opening. An isolation dielectric is formed between the first and second terminal materials.

In one or more twenty-fourth examples, for any of the twenty-third examples forming the first, second, and third layers further comprises epitaxially growing the III-N material with the c-axis oriented substantially normal to a plane of the intervening material layers.

In one or more twenty-fifth examples, for any of the twenty-third examples forming the first layer further comprises epitaxially growing GaN with a Ga-face proximal to the first intervening material layer and a N-face proximal to the second intervening material layer. Forming the second layer further comprises epitaxially growing GaN with a Ga-face proximal to the first intervening material layer. Forming the third layer further comprises epitaxially growing GaN with a N-face proximal to the second intervening material layer.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A light emitter structure, comprising:
   a quantum well (QW) structure with a first layer comprising a Group III-nitride (III-N) material having a first crystal polarity;
   a second layer comprising a III-N material having a second crystal polarity, inverted from the first crystal polarity;
   an intervening material layer between the QW structure and the second layer, wherein the intervening material layer comprises other than a III-N material; and
   a first contact and a second contact electrically coupled across the QW structure.

2. The light emitter structure of claim 1, wherein:
   the first contact is electrically coupled to the first layer through a terminal layer comprising a III-N alloy having a higher concentration of acceptor impurities than the first layer; and
   the QW structure is between the intervening material layer and the second contact.

3. The light emitter structure of claim 2, wherein a sidewall of the terminal material contacts a sidewall of the first layer proximal to a positive charge carrier sheet that is near the interface of the first layer and the intervening material layer.

4. The light emitter structure of claim 2, further comprising:
   a third layer comprising a III-N material having the second crystal polarity;
   a second intervening material layer between the first layer and the third layer, wherein the second intervening material layer comprises other than a III-N material; and
   wherein the second contact is coupled to a negative charge carrier sheet that is near the interface of the first III-N material and the second intervening material layer through a second terminal material comprising a III-N alloy having a higher concentration of donor impurities than the first layer.

5. The light emitter structure of claim 4, wherein:
   a group III-face of the first layer is adjacent to one of the intervening material layers and a nitrogen (N)-face of the second layer is adjacent to another of the intervening material layers;
   a group III-face of the second layer is facing the group III-face of the first layer; and
   a nitrogen (N)-face of the third layer is facing the nitrogen (N)-face of the third layer.

6. The light emitter structure of claim 5, wherein a c-axis of the first, second and third layers is oriented substantially normal to a plane of the intervening material layers with polar faces of the first, second, and third layers separated by the intervening material layers.

7. The light emitter structure of claim 5, wherein:
   at least the first and third layers comprise the same III-N material; and
   the terminal material has a higher concentration of Indium than the first and third layers.

8. The light emitter structure of claim 4, wherein:
   a first terminal material comprising a III-N alloy contacts a sidewall of the first layer proximal to a positive charge carrier sheet of a first polarization junction near the intervening material layer; and
   the second terminal material comprising a III-N alloy contacts a surface of the first layer proximal to a negative charge carrier sheet of a second polarization junction near the second intervening material layer.

9. The light emitter structure of claim 8, further comprising a dielectric material between the first and second terminal materials, wherein the dielectric material extends through the first polarization junction but not the second polarization junction.

10. The light emitter structure of claim 1, wherein:
    the QW structure comprises the first layer and one or more QW layers having a bandgap smaller than that of the first layer;
    the first contact is electrically coupled to the first layer through a first terminal material comprising a III-N alloy having a higher concentration of acceptor impurities than the first layer;
    the second contact is electrically coupled to the second layer through a second terminal material comprising a III-N alloy having a higher concentration of donor impurities than the second layer; and
    an isolation dielectric material laterally separates the first terminal material from the second terminal material, from the second layer, and from the QW layers.

11. The light emitter structure of claim 10, wherein a bottom of the first III-N terminal material contacts an area of a positive charge carrier sheet that is near the interface of the first layer and the intervening material layer.

12. The light emitter structure of claim 1, wherein the intervening material layers each comprise oxygen and at least one of a metal, a rare earth, or a lanthanide.

13. The light emitter structure of claim 12, wherein the intervening material layers are crystalline.

14. The diode structure of 12, wherein the intervening material layers are amorphous.

15. A computer platform including:
    a processor; and
    one or more optical transceiver coupled to the processor, wherein the optical transceiver includes the light emitter of claim 1.

16. The computer platform of claim 15, further comprising a battery coupled to at least one of the processor and optical transceiver.

17. A method of forming a light emitter, the method comprising:
    epitaxially growing a quantum well (QW) structure over a crystalline seed layer, wherein the QW structure has a first layer comprising a Group III-nitride (III-N) material of a first crystal polarity, and one or more QW layers having a bandgap smaller than that of the first layer;
    depositing, over the QW structure, an intervening material layer comprising other than a III-N material;
    forming, over the first intervening material layer, a second layer comprising a III-N material having a second crystal polarity, opposite the first polarity;
    forming a first contact to a positive charge carrier sheet of a polarization junction near the intervening material layer; and
    forming a second contact to a III-N material separated from the first layer by the one or more QW layers.

18. The method of claim 17, further comprising:
    forming a third layer comprising a III-N material of the first crystal polarity; and
    depositing, over the third layer, a second intervening material layer comprising other than a III-N material; and
    wherein the QW structure is grown over the second intervening material layer.

19. The method of claim 18, wherein forming at least one of the first and second intervening material layers further comprises:
epitaxially depositing a precursor material layer comprising Al; and
oxidizing the precursor material layer.

* * * * *